United States Patent
Boulos et al.

(10) Patent No.: US 8,263,178 B2
(45) Date of Patent: Sep. 11, 2012

(54) PLASMA SURFACE TREATMENT USING DIELECTRIC BARRIER DISCHARGES

(75) Inventors: Maher I. Boulos, Sherbrooke (CA);
Ulrich Kogelschatz, Hausen AG (CH);
Christine Nessim, Sherbrooke (CA)

(73) Assignee: Tekna Plasma Systems Inc., Sherbrooke (CA)

( * ) Notice: Subject to any disclaimer, the term of this patent is extended or adjusted under 35 U.S.C. 154(b) by 228 days.

(21) Appl. No.: 11/831,654

(22) Filed: Jul. 31, 2007

(65) Prior Publication Data

US 2008/0145553 A1  Jun. 19, 2008

Related U.S. Application Data

(60) Provisional application No. 60/834,166, filed on Jul. 31, 2006, provisional application No. 60/836,403, filed on Aug. 9, 2006.

(51) Int. Cl.
*B05D 5/00* (2006.01)
*H05H 1/24* (2006.01)
*H05H 1/02* (2006.01)
*C23C 16/00* (2006.01)
*H01J 7/24* (2006.01)
*H05B 31/20* (2006.01)

(52) U.S. Cl. ........ 427/212; 427/569; 427/570; 118/715; 315/111.21

(58) Field of Classification Search .................. 427/569, 427/570
See application file for complete search history.

(56) References Cited

U.S. PATENT DOCUMENTS

| 6,245,299 B1 * | 6/2001 | Shiloh et al. .................. 422/121 |
| 2003/0007910 A1 * | 1/2003 | Diamant Lazarovich et al. .................. 422/186.18 |
| 2006/0244386 A1 * | 11/2006 | Hooke et al. ............. 315/111.21 |

FOREIGN PATENT DOCUMENTS

| CA | 2244749 | * | 8/1997 |
| CA | 2343160 | | 3/2000 |
| CA | 2344268 | | 6/2000 |
| CA | 2377268 | | 12/2000 |
| JP | 04135638 | | 5/1992 |
| JP | 6-65739 | | 3/1994 |
| JP | 6-502686 | | 3/1994 |
| JP | 6-123067 | | 5/1994 |
| JP | 7-328427 | | 12/1995 |

(Continued)

OTHER PUBLICATIONS

Sawada and Kogoma, Plasma-polymerized tetrafluoroethylene coatings on silica particles by atmospheric-pressure glow discharges, Powder Technology 90 (1997) 245-250.*

(Continued)

*Primary Examiner* — Michael Cleveland
*Assistant Examiner* — James M Mellott
(74) *Attorney, Agent, or Firm* — Fulbright & Jaworski L.L.P.

(57) ABSTRACT

A process for the in-flight surface treatment of powders using a Dielectric Barrier Discharge Torch operating at atmospheric pressures or soft vacuum conditions is described herein. The process comprising feeding a powder material into the Dielectric Barrier Discharge Torch yielding powder particles exhibiting a reduced powder agglomeration feature; in-flight modifying the surface properties of the particles; and collecting coated powder particles. An apparatus for surface treating micro- and nanoparticles comprising a Dielectric Barrier Discharge Torch operating at atmospheric pressure or soft vacuum conditions is also described herein.

9 Claims, 29 Drawing Sheets

FOREIGN PATENT DOCUMENTS

| | | |
|---|---|---|
| JP | 2002-110397 | 4/2002 |
| JP | 2005-322416 | 11/2005 |
| RU | SU 1620210 | 1/1991 |
| WO | WO 2005/039753 | 5/2005 |

OTHER PUBLICATIONS

PCT International Search Report, issued in International Application No. PCT/CA2007/001349, dated Nov. 20, 2007.

Bretagnol et al., "Surface modification of polyethylene powder by nitrogen and ammonia low pressure plasma in a fluidized bed reactors," *Reactive and Functional Polymers*, 61:221-232, 2004.

Chau et al., "Microwave plasma synthesis of Co and SiC-coated Co nanopowders," *Materials Letters*, 60:947-651, 2006.

Chau et al., "Microwave plasma synthesis of silver nanopowders," *Materials Letters*, 59:905-908, 2005.

Dumitrache et al., "Nearly monodispersed carbon coated iron nanoparticles for the catalytic growth of nanotubes/nanofibers," *Diamond and Related Materials*, 13:362-370, 2004.

Ermoline et al., "Production of carbon-coated aluminium nanopowders in pulsed microarc discharge," *Nanotechnology*, 13:638-643, 2002.

He et al., "Polymer coating on the surface of zirconia nanoparticles by inductively coupled plasma polymerization," *Applied Phys. Letters*, 85:896-898, 2004.

Kogelschatz and Eliasson, "Ozone Generation and Applications," *Handbook of Electrostatic Processes*, (Chang et al., eds.), Marcel Dekkar, New York, 581-605, 1995.

Kogelschatz et al., "DC and Low Frequency Air Plasma Sources," *Non-Equilibrium Air Plasmas at Atmospheric Pressure, IOP*, (Becker et al.) 276-306, 2004.

Kogelschatz, "Dielectric-barrier Discharges : Their History, Discharge Physics and Industrial Applications," *Plasma Chemistry and Plasma Processing*, 23:146, 2003.

Kogelschatz, "Filamentary, Patterned, and Diffuse Barrier Discharges," *IEEE Transactions on Plasma Science*, 30:1400-1408, 2002.

Kouprine et al., "Polymer-like C:H Thin Film Coating of Nanopowders in Capacitively Coupled RF Discharge," *Plasma Chemistry and Plasma Processing*, 24:189-216, 2004.

Lei et al., "In situ organic coating of metal nanoparticles," *Applied Physics Letters*, 88:086111, 2006.

Leroy et al., "Treatment of a Polyethylene Powder Using a Remote Nitrogen Plasma Reactor Couples with a Fluidized Bed: Influence on Wettability and Flowability," *Plasma and Polymers*, 8:13-29, 2003.

Manley, "The electric characteristics of the ozonator discharge," *Trans. Electrochem. Soc.*, 84:83, 1943.

Sawada and Kogoma, "Plasma-polymerized tetrafluoroethylene coatings on silica particles by atmospheric-pressure glow discharge," *Powder Technology*, 90:245-250, 1997.

Schallehn et al., "In-Situ Preparation of Polymer-Coated Alumina Nanopowders by Chemical Vapor Synthesis," *Chem. Vap. Deposition*, 9:40-44, 2003.

Shi et al., "Plasma deposition of Ultrathin polymer films on carbon nanotubes," *Applied Phys Letters*, 81:5216-5218, 2002.

Shi et al., "Uniform deposition of ultrathin polymer films on the surfaces of $Al_2O_3$ nanoparticles by a plasma treatment," *Applied Phys. Letters*, 78:1243-1245, 2001.

Vollath and Szabo, "Coated nanoparticles: A new way to improved nanocomposites," *J. Nanoparticle Res.*, 1:235-242, 1999.

Vollath et al., "Oxide/polymer nanocomposites as new luminescent materials," *J. Nanoparticle Res.*, 6:181-191, 2004.

Vons et al., "Nanoparticle production using atmospheric pressure cold plasma," *Journal of Nanoparticle Research*, 8:721-728, 2006.

Jiao et al., "Preparation and properties of ferromagnetic carbon coated Fe, Co, and Ni nanoparticles," *J. Appl. Phys.*, 80(1):103-108, 1996.

Decision of Grant, issued in Russian Application No. 2009107047, mailed on Apr. 27, 2012. (English translation enclosed).

Office Action issued in Japanese Application No. 2009-522066, mailed Jun. 5, 2012. (English translation enclosed).

\* cited by examiner

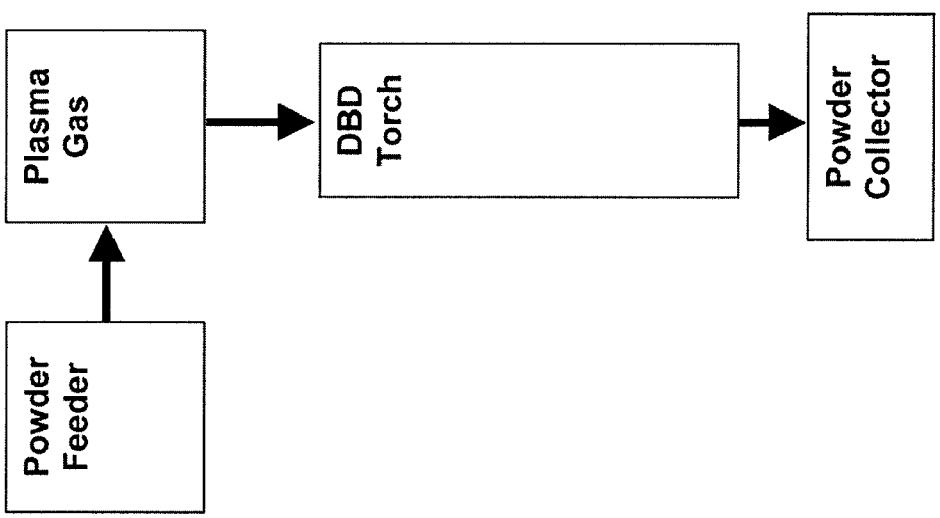
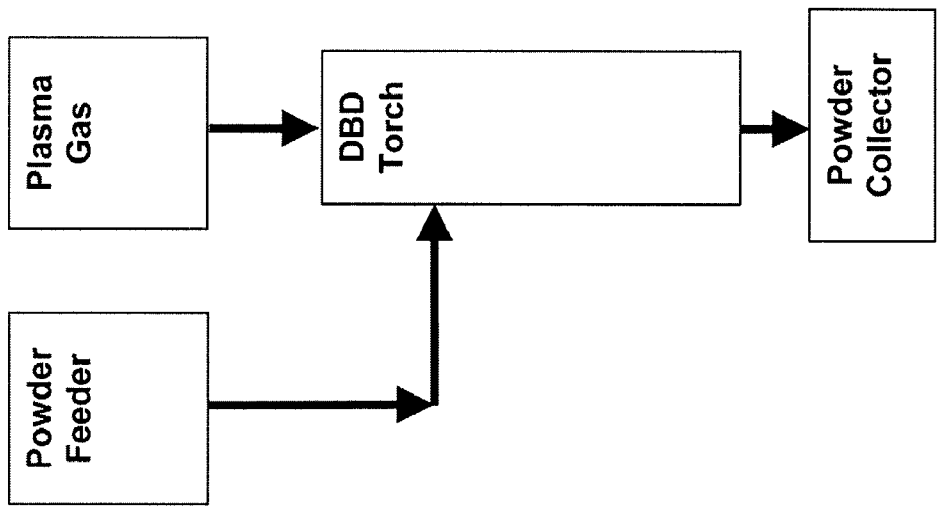

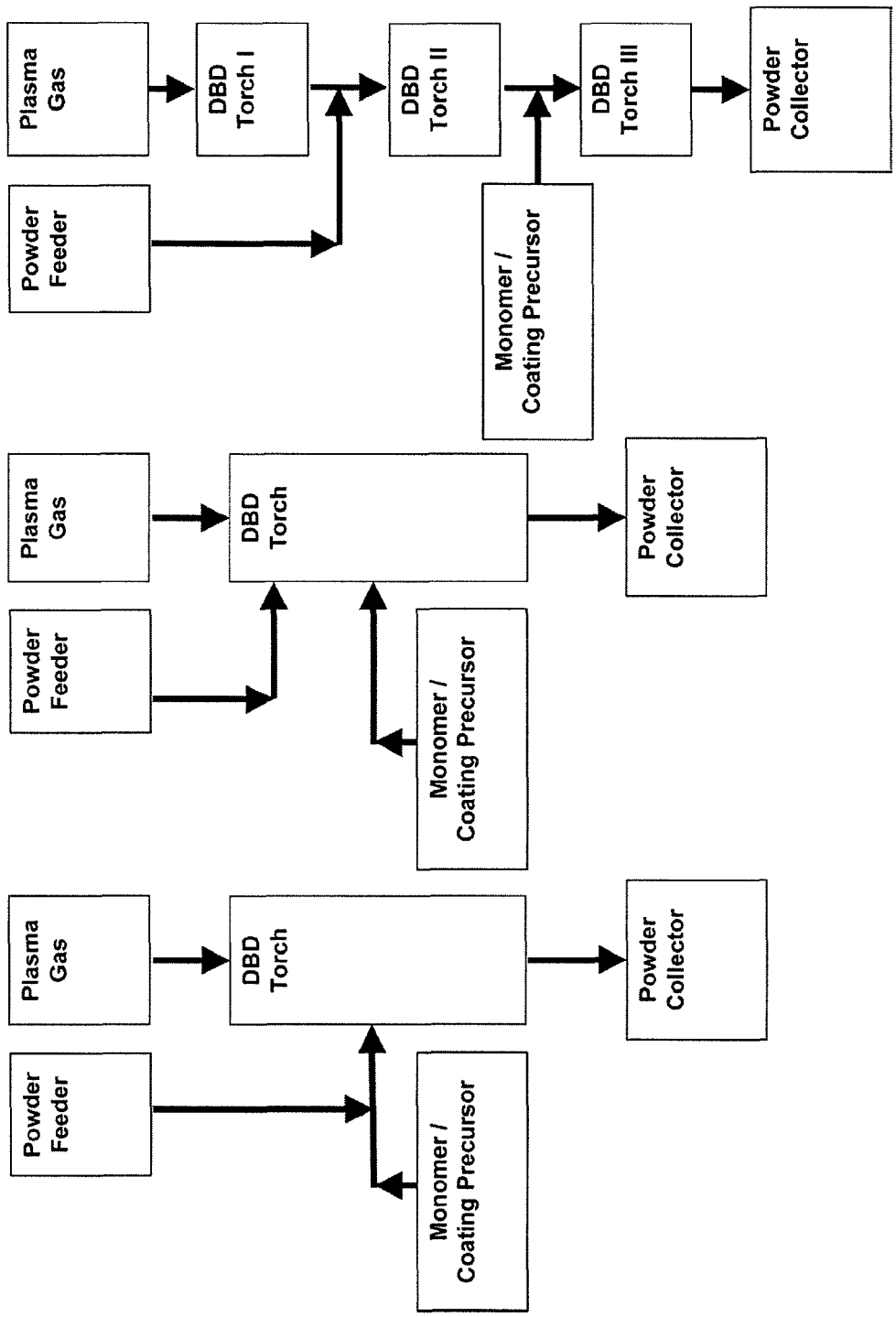

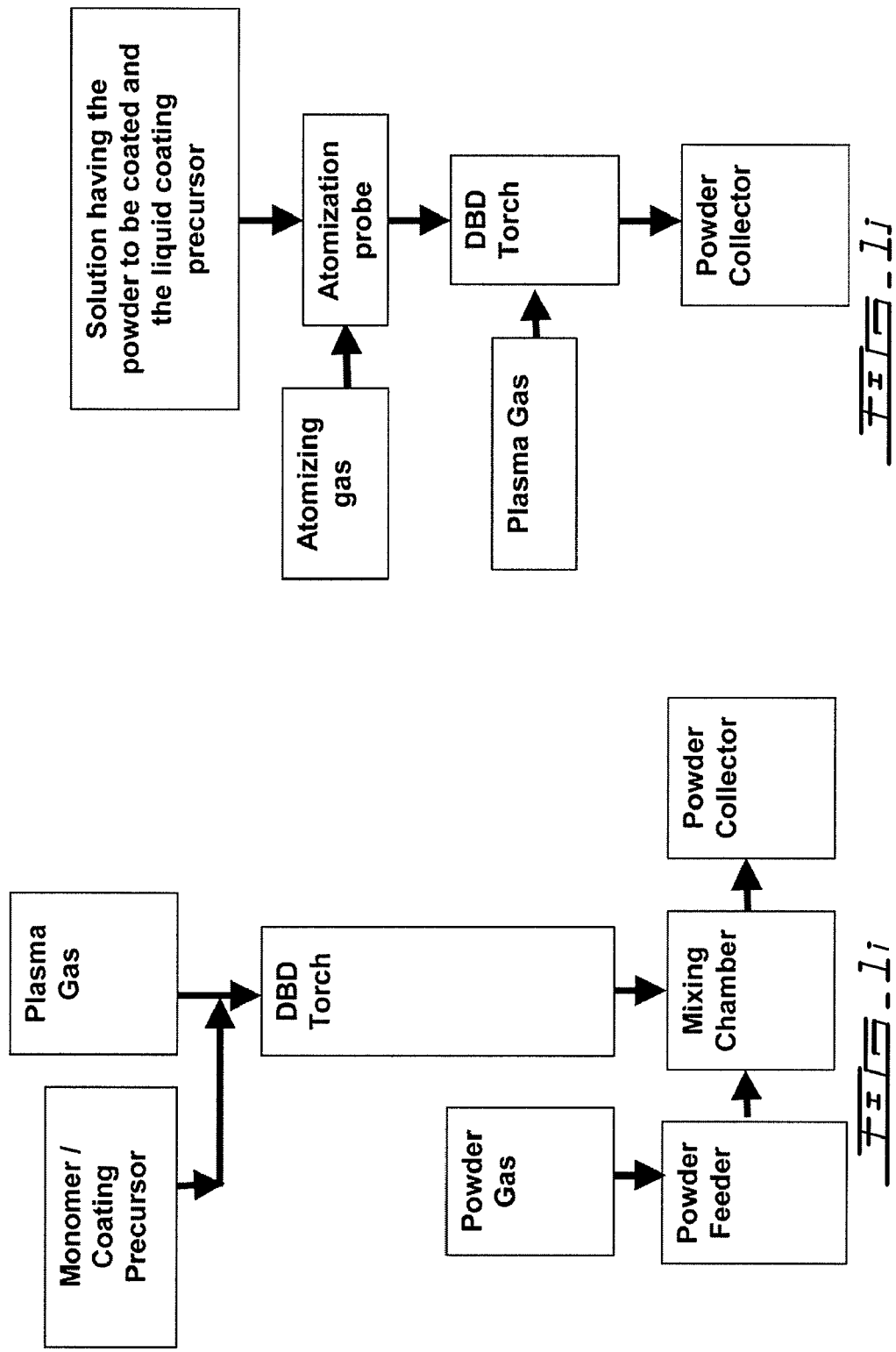

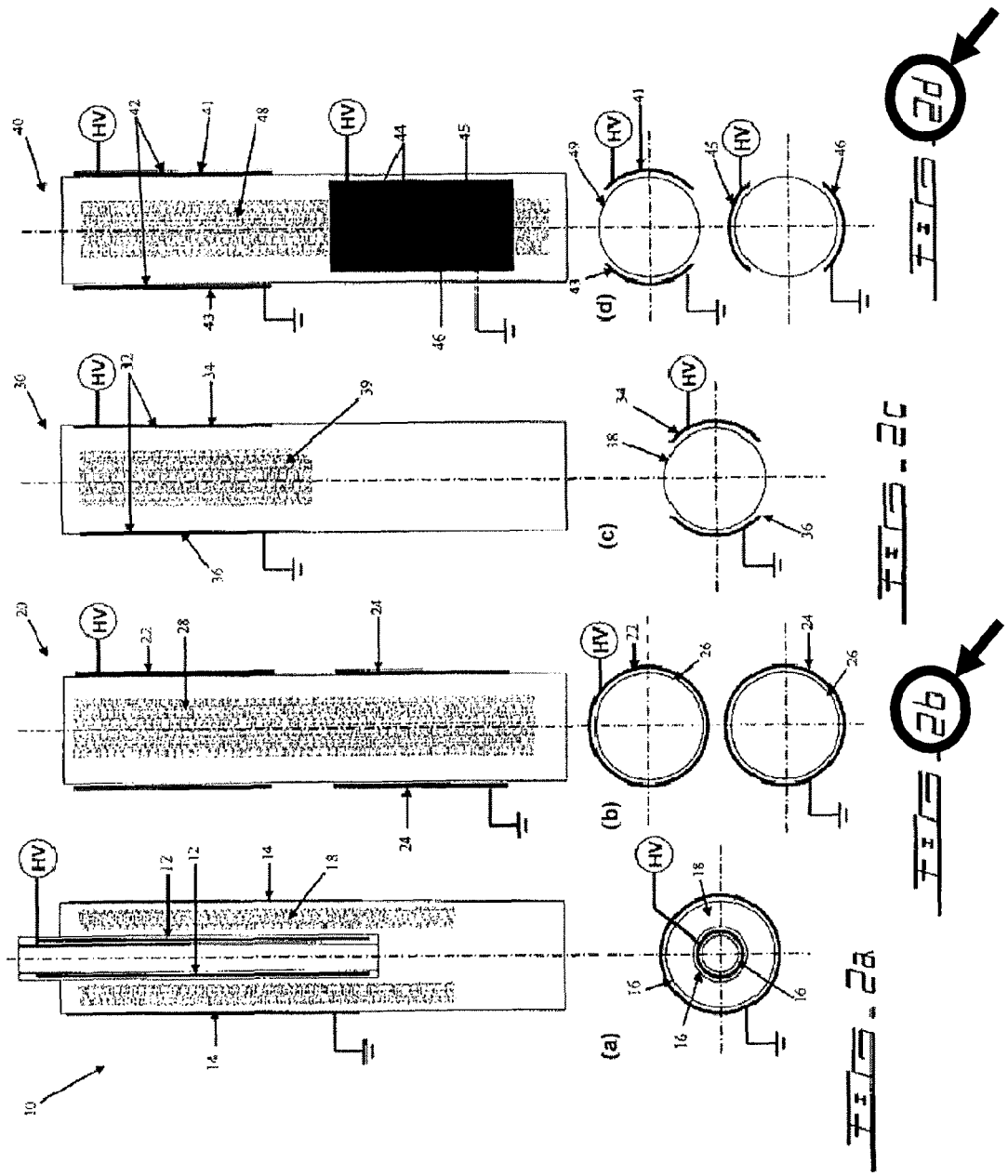

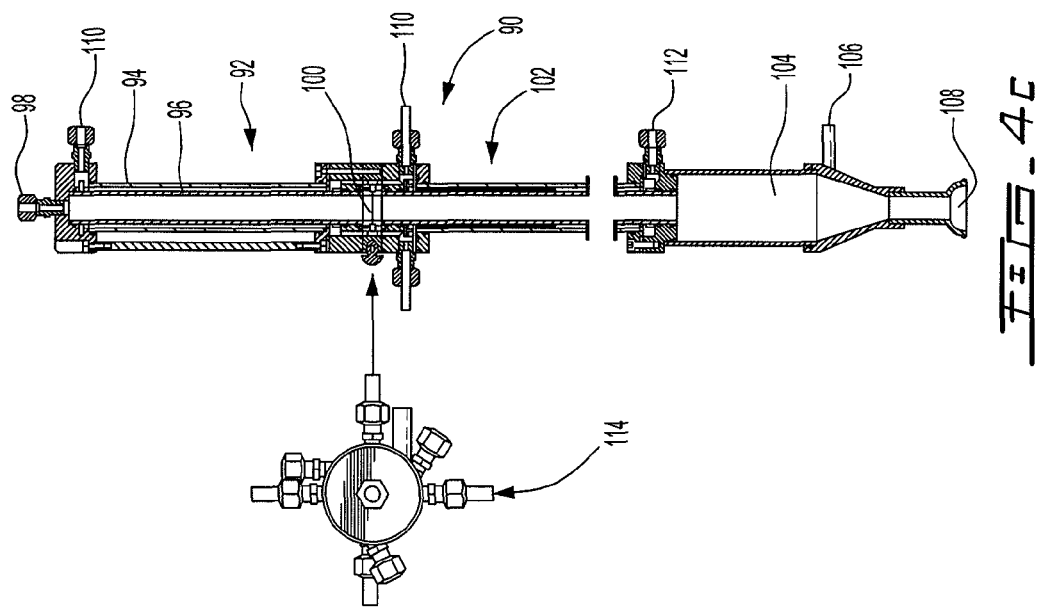
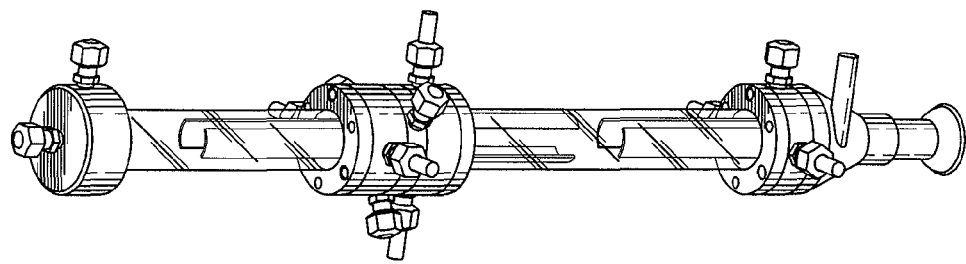

PLASMA SURFACE TREATMENT USING DIELECTRIC BARRIER DISCHARGES

CROSS REFERENCE TO RELATED APPLICATIONS

The present application claims the benefit of U.S. Provisional Applications No. 60/834,166 and 60/836,403 filed Jul. 31, 2006 and Aug. 9, 2006 respectively, the entire contents of which are incorporated by reference.

FIELD OF THE INVENTION

The present disclosure relates to the plasma surface treatment of micro- and nanoparticles by means of dielectric barrier discharges. More specifically, but not exclusively, the present disclosure relates to a process for the coating of micro- and nanoparticles by means of a Dielectric Barrier Discharge Torch (DBDT) operating at atmospheric pressures or soft vacuum conditions. The present disclosure also relates to an apparatus for the coating of micro- and nanoparticles, the apparatus comprising a Dielectric Barrier Discharge Torch (DBDT) operating at atmospheric pressure or soft vacuum conditions.

BACKGROUND OF THE INVENTION

Nanopowders have unique physical properties that are directly related to their small size and high specific surface area. Nanopowders exhibit an inherent propensity to agglomerate, resulting in an increase of their apparent particle size. Agglomeration has a direct impact on the functional properties of the nanopowder such as their optical and magnetic characteristics as well as the catalytic and conductive properties.

Because of their high specific surface area, nanopowders are very reactive and difficult to handle. The deposition of a thin film, or other coating material on the outer surface of the individual particles, prevents their agglomeration and provides for their safe handling without compromising their unique properties.

The choice of coating material, i.e. polymer-type or other, provides for a selective control over the surface characteristics of the powder. The hydrophilicity of a powder can be modified, in addition to controlling other intrinsic properties, by surface treatment of the powder and/or by the proper selection of a coating material. A stable pyrophoric nano-aluminum powder (ignites readily at ambient temperature) can be created by the application of a thin polymeric film coating the surface of the particles. Such a coating provides for a stable powder at lower temperatures while not adversely affecting its high energetic value at higher temperatures.

Plasma surface treatment has been previously used as a surface modification technique to enhance the hydrophobicity, hydrophilicity, adhesion, and corrosion resistance of a great many substrates, including polymeric films. It has also found widespread use in cleaning and etching applications.

Plasma deposition and plasma polymerization techniques have been developed to apply thin coatings, e.g. polymeric films, onto a variety of substrates. Most of these techniques operate at fairly low pressures (smaller than 100 Pa).

Thin film-coating has been previously reported as changing the surface properties of nanopowders, while decreasing their agglomeration and improving their dispersion characteristics. The coating of zirconia ($ZrO_2$) nanopowders (~130 nm) with a polyethylene film, using an RF plasma torch (27 MHz) operating at low pressure (30 Pa), has been reported by He et al (1).

The coating of alumina ($Al_2O_3$) nanoparticles (~10-150 nm) with a polypyrrole film, using an RF plasma torch (13.56 MHz) operating at low pressure (25 Pa), has been reported by Shi et al. (2). A thin polypyrrole film was deposited at a discharge power of 10 W. A fluidized bed kept under vacuum was used to introduce the alumina nanopowder (0.16 g/min). Shi et al. also reported on the deposition of a polystyrene film on nanocarbon tubes using a similar process (3).

The coating of alumina ($Al_2O_3$) nanoparticles with an ethane-based polymeric layer having a thickness of about 1.5 nm, using an RF plasma torch (13.56 MHz) operating at low pressure (1 kPa), has been reported by Schallehn et al. (4). Coated alumina ($Al_2O_3$) nanoparticles were produced at a rate of 0.5-1 g/h and at yields of about 40%.

A microwave (MW) plasma torch operating at high frequency (2.45 GHz) and low pressure (1-5 kPa) has been reported by Vollath et al. to coat nano-oxide powders such as zirconia ($ZrO_2$), alumina ($Al_2O_3$), tungsten oxide ($WO_2$, $WO_3$), hafnium oxide ($HfO_2$), tin oxide (SnO, $SnO_2$), and iron oxide ($Fe_2O_3$) (5, 6). The film coating was achieved using methyl methacrylate as the polymer precursor. The monomer was introduced at the exit of the plasma torch discharge and was polymerized under the influence of the UV radiation emitted from the plasma.

The preparation and coating of silver nanoparticles with a polymeric layer, using a MW plasma torch operating at high frequency (2.45 GHz) and low pressure has been reported by Lik Hang Chau et al. (7). The same author also reported on the preparation and coating of cobalt nanoparticles with a silicon carbide layer, using a MW plasma torch (8). $CoCl_2$ and $SiCl_4$/Hexane were the precursors for the preparation and coating respectively.

The coating of fine silica powders ranging in size from 30-80 nm, using a capacitive plasma torch (13.6 MHz) operating at low pressure (1-5 kPa), was described by Kouprine et al. (9). The plasma discharge power was set at 700-1500 W and the plasma gas was comprised of a mixture of argon and, methane or ethane. A fluidised bed was used to introduce the silica powder feed material.

The synthesis and carbon-coating of iron nanoparticles by means of laser pyrolysis, using a continuous wave $CO_2$ laser operating at a power setting of 120 W, a wavelength ($\lambda$) of 10.6 micrometers and a pressure of 700 mbar, has been reported by Dumitrache et al. (10). Iron carbonyl and acetylene were the precursors for the powder synthesis and coating respectively.

The synthesis and carbon coating of aluminum particles using a DC plasma arc discharge torch (1-50 V; 30-150 A) operating at atmospheric pressure has been reported by Ermoline et al. (11). The cathode was reported as being composed of copper, while the anode was comprised of a consumable aluminum rod. Ablation of the anode was carried out in pulse mode to produce coated nano-aluminum particles. The carbon coating was achieved using natural gas.

The coating of porous granulated silica particles (~150 μm) with a thin film of plasma-polymerized tetrafluoroethylene (TFE), using an Atmospheric Pressure Glow Discharge (APGD) in a specially designed plasma discharge torch (15 kHz; 100 kPa; 10 W), has been reported by Sawada et al. (12). The plasma feed gas was comprised of helium and TFE (1%). The silica particles were reported as being recirculated several times through the plasma region.

The carbon coating of copper nanoparticles using a DBD torch operating at atmospheric pressure was reported by Lei et al. (13). Copper nanoparticles were produced using a flow levitation method wherein a copper wire is heated with high frequency electromagnetic coils. The copper nanoparticles produced were subsequently carbon coated in situ by means of a DBD torch using argon, hydrogen and methane and operating at atmospheric pressure.

Bretagnol et al. (19) studied the surface modification of low density polyethylene (LDPE) powder in a low pressure RF plasma operating at 13.56 MHz and using nitrogen and ammonia as the processing gas. The powder was recirculated in a fluidized bed reactor. Residence times in the order of 300 seconds were needed to alter the particles' wettability.

Polyethylene powders have also been treated as disclosed by Leroy et al. (20). The plasma discharge was coupled to a fluidized bed reactor and the powder was treated in the after glow region of the plasma. The processing gas was a mixture of oxygen and nitrogen. A microwave plasma having a frequency of 2450 MHz was used and operated at low pressures of 0.1 to 20 mbar.

The present disclosure refers to a number of documents, the content of which is herein incorporated by reference in their entirety.

SUMMARY OF THE INVENTION

The present disclosure relates to a process for the preparation of surface treated micro- and/or nanoparticles. In an embodiment, the present disclosure relates to a process for the preparation of surface treated micro- and nanoparticles using a Dielectric Barrier Discharge Torch operating at atmospheric pressures or soft vacuum conditions. In a typical embodiment of surface treatment, the present disclosure relates to a process in which the surface chemistry of the micro- and/or nanoparticles is modified by means of reaction with the plasma discharge. In a further typical embodiment of surface treatment, the present disclosure relates to a process in which the surface chemistry of the micro- and/or nanoparticles is modified by means of deposition of a coating material.

In an embodiment, the present disclosure relates to a process for the preparation of coated micro- and nanoparticles in which the thickness of the applied coating (i.e. film) may be advantageously controlled. The thickness of the coating typically ranges from less than one nanometer to hundreds of nanometers.

More specifically, as broadly claimed, the present disclosure relates to a process for surface treating powder particles by means of a Dielectric Barrier Discharge Torch operating at atmospheric pressures or soft vacuum conditions, the process comprising: (a) introducing a powder feed material into the Dielectric Barrier Discharge Torch; (b) modifying the surface chemistry of the powder feed material by means of reaction with the plasma discharge; and (c) collecting surface treated particles.

More specifically, as broadly claimed, the present disclosure relates to a process for surface treating powder particles comprising (a) feeding a particulate powder material into a Dielectric Barrier Discharge Torch assembly; (b) in-flight modifying the surface properties of the particles in the Dielectric Barrier Discharge Torch producing surface treated particles; and (c) collecting the surface treated particles. In an embodiment of the present disclosure, the in-flight modifying comprises reacting the surface of the particles with the plasma discharge. In a further embodiment of the present disclosure, the in-flight modifying comprises generating a coating material by means of injection of a coating material precursor into the Dielectric Barrier Discharge Torch assembly and depositing the coating material on the surface of the particles, producing coated particles.

More specifically, as broadly claimed, the present disclosure relates to a process for surface treating powder particles by means of a Dielectric Barrier Discharge Torch operating at atmospheric pressures or soft vacuum conditions, the process comprising: (a) introducing a powder feed material into the Dielectric Barrier Discharge Torch; (b) introducing at least one surface treating material into the Dielectric Barrier Discharge Torch, the material producing surface treated powder particles; and (c) collecting surface treated particles.

More specifically, as broadly claimed, the present disclosure relates to a process for surface treating powder particles by means of a Dielectric Barrier Discharge Torch operating at atmospheric pressures or soft vacuum conditions, the process comprising: (a) introducing at least one surface treating material precursor into the Dielectric Barrier Discharge Torch producing a coating species; (b) contacting the coating species with a powder feed material; and (c) collecting surface treated powder particles.

More specifically, as broadly claimed, the present disclosure relates to a process for surface treating powders by means of a Dielectric Barrier Discharge Torch operating at atmospheric pressures or soft vacuum conditions, the process comprising: (a) introducing an atomized liquid feed material comprising a dispersed powder and at least one surface treating material precursor into the Dielectric Barrier Discharge Torch; and (c) collecting surface treated powder particles.

In an embodiment, the present disclosure relates to an apparatus comprising a Dielectric Barrier Discharge Torch operating at atmospheric pressures or soft vacuum conditions, for producing surface treated micro- and nanoparticles.

In an embodiment, the present disclosure relates to an apparatus for in-flight surface treating powder particles, the apparatus comprising:

a dielectric barrier discharge torch including: (i) a first inlet for feeding the torch with a plasma gas; (ii) a second inlet for feeding the torch with a particulate powder material; and (iii) a discharge chamber for treating the particulate powder material, the reaction chamber comprising an electrode structure disposed on the outer surface thereof; and means for collecting the surface treated particles;

wherein, a plasma discharge is created by passing a plasma forming gas through the discharge chamber; the plasma discharge causes in-flight modification of the surface properties of the particles.

The present disclosure also relates to surface treated micro- and nanoparticles. In an embodiment, the present disclosure relates to micro- or nanoparticles comprising an organic coating. In an embodiment, the present disclosure relates to micro- or nanoparticles comprising an inorganic coating. In an embodiment, the present disclosure relates to micro- or nanoparticles comprising a metallic coating. In a typical embodiment, the present disclosure relates to micro- or nanoparticles comprising an oxide coating. In a further typical embodiment, the present disclosure relates to micro- or nanoparticles comprising a nitride coating. In a further typical embodiment, the present disclosure relates to micro- or nanoparticles comprising a carbide coating.

The present disclosure also relates to micro- and nanoparticles comprising a coating produced by means of a Dielectric Barrier Discharge Torch operating at atmospheric pressures or soft vacuum conditions.

The present disclosure also relates to surface treated micro- and nanoparticles wherein the surface treatment is achieved by means of a Dielectric Barrier Discharge Torch operating at atmospheric pressures or soft vacuum conditions.

The present disclosure also relates to a Dielectric Barrier Discharge Torch operating at atmospheric pressures or soft vacuum conditions for surface treating micro- and/or nanoparticles. In an embodiment, the present disclosure relates to a Dielectric Barrier Discharge Torch operating at atmospheric pressures or soft vacuum conditions for modifying the surface chemistry of micro- and/or nanoparticles. In an embodiment, the present disclosure relates to a Dielectric Barrier Discharge Torch operating at atmospheric pressures or soft vacuum conditions for coating micro- and/or nanoparticles with an organic coating. In an embodiment, the present disclosure relates to a Dielectric Barrier Discharge Torch operating at atmospheric pressures or soft vacuum conditions for coating micro- and/or nanoparticles with an inorganic coating. In an embodiment, the present disclosure relates to a Dielectric Barrier Discharge Torch operating at atmospheric pressures or soft vacuum conditions for coating micro- and/or nanoparticles with a metallic coating. In an embodiment, the present disclosure relates to a Dielectric Barrier Discharge Torch operating at atmospheric pressures or soft vacuum conditions for producing micro- and/or nanoparticles having an oxidized surface.

Finally, in an embodiment, the present disclosure relates to the use of a Dielectric Barrier Discharge Torch for in-flight surface treatment of powder particles.

The foregoing and other objects, advantages and features of the present disclosure will become more apparent upon reading of the following non-restrictive description of illustrative embodiments thereof, given by way of example only with reference to the accompanying drawings.

BRIEF DESCRIPTION OF THE DRAWINGS

In the appended drawings:

FIG. 2 (a-d) illustrates various electrode configurations for the generation of dielectric barrier discharges for the surface treatment and/or coating of micro- and nanoparticles in accordance with the present disclosure: (a) a concentric electrode configuration; (b) a co-axial electrode configuration; (c) a shell electrode configuration; and (d) a multiple-staggered electrode configuration.

FIG. 4 shows: (a) a photograph of a Dielectric Barrier Discharge Torch assembly comprising a multiple-staggered shell electrode configuration in operation, in accordance with an embodiment of the present disclosure; (b) an illustration of a Dielectric Barrier Discharge Torch assembly comprising a water cooled multiple-staggered shell electrode configuration in accordance with an embodiment of the present disclosure; and (c) a schematic cross-sectional elevational view of a Dielectric Barrier Discharge Torch assembly comprising a water cooled multiple-staggered shell electrode configuration, illustrating various injection ports and water cooling channels.

DETAILED DESCRIPTION OF ILLUSTRATIVE EMBODIMENTS

Figure 1A:
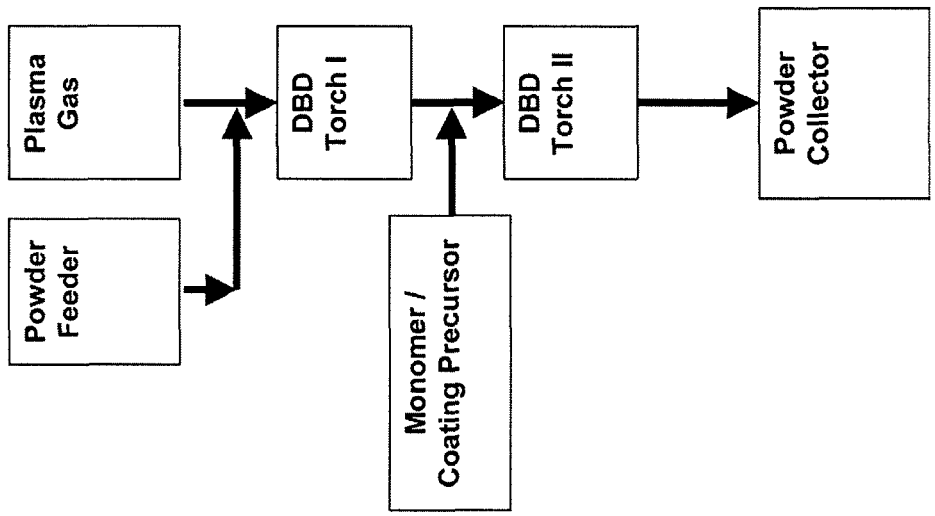
FIG. 1 (a-j) illustrates block diagrams of various configurations for the surface treatment and/or coating of micro- and nanoparticles in accordance with the present disclosure.

In order to provide a clear and consistent understanding of the terms used in the present specification, a number of definitions are provided below. Moreover, unless defined otherwise, all technical and scientific terms as used herein have the same meaning as commonly understood to one of ordinary skill in the art to which this invention pertains.

The use of the word "a" or "an" when used in conjunction with the term "comprising" in the claims and/or the specification may mean "one", but it is also consistent with the meaning of "one or more", "at least one", and "one or more than one". Similarly, the word "another" may mean at least a second or more.

As used in this specification and claim(s), the words "comprising" (and any form of comprising, such as "comprise" and "comprises"), "having" (and any form of having, such as "have" and "has"), "including" (and any form of including, such as "include" and "includes") or "containing" (and any form of containing, such as "contain" and "contains"), are inclusive or open-ended and do not exclude additional, unrecited elements or process steps.

The term "about" is used to indicate that a value includes an inherent variation of error for the device or the method being employed to determine the value.

As used in this specification, the term "atmospheric pressures or soft vacuum conditions" refers to pressures ranging from about 5 atmospheres down to about 50 Torr.

As used in this specification, the term "lower frequencies" refers to a frequency of 1 MHz or less.

As used in this specification, the term "surface treating" refers to either a process in which the surface of a particle is reacted with the gaseous environment (i.e. the plasma discharge) or a process in which a coating material is deposited on the surface of a particle. The coating material typically comprises a different chemical composition than the particle. A non-limiting example of a process in which the surface of the particle is reacted with the gaseous environment comprises an oxidation process. Such a process typically results in the formation of an oxide layer. Processes in which the surface of the particle is reacted with the gaseous environment typically result in changes in the physical and chemical properties of the surface. Non-limiting examples of the effects of "surface treating" include increased resistance to oxidation and/or burning (i.e. surface pacivation), modified hydrophilic and hydrophobic properties and reduced powder agglomeration tendency.

As used in this specification, the term "metallic" refers to all metal-containing materials. This includes but is not limited to pure metals, metalloids, metal alloys and similar combinations that would be obvious to a skilled technician.

As used in this specification, the term "coating" refers to all types of coatings. This includes but is not limited to porous (e.g. containing spaces devoid of coating) and non-porous coatings. In a non-porous coating, the coating is typically applied over the entire surface of the particle in a fully continuous manner whereby none of the original surface of the particle remains exposed. In a porous coating, the surface of the particle is at least partially coated.

As used interchangeably in this specification, the terms "substantially uniform" or "substantially homogeneous", when used to describe a coating, means that there are few of no significant local variations in the coating.

The present disclosure relates to a process for surface treating powder particles by means of a Dielectric Barrier Discharge Torch operating at atmospheric pressures or soft vacuum conditions. In an embodiment of the present disclosure, the powder particles comprise polymeric micro- and nanoparticles, metallic micro- and nanoparticles or combinations thereof. In a further embodiment of the present disclosure, the powder particles comprise metal oxide micro- and nanoparticles. The surface treatment results in a modification of the surface chemistry of the micro- and nanoparticles or, alternatively, produces coated particles comprising a coating layer ranging in thickness from less than about 1 nm to about 50 nm. In an embodiment of the present disclosure, the coating comprises a polymeric material. In yet a further embodiment of the present disclosure, the coating comprises a metallic, oxide, nitride or carbide coating. Other coatings, not limited to silica-like coatings, are known in the art, and are within the capacity of a skilled technician.

Dielectric barrier discharges are typically characterized by the presence of at least one dielectric barrier (i.e. insulator)

and a discharge space located in between a pair of electrodes. Moreover, dielectric barrier discharges have been previously described as being capable of breaking chemical bonds, excite atomic and molecular species and generate active species such as free radicals. Non-limiting examples of active species within the context of the present disclosure comprise atoms such as He, Ar and Ne, either in their electronic ground state or in an exited state; molecules such as $N_2$, either in their electronic ground state or in an exited state such as $N_2$, $N_2^*$, $N_2^+$; and molecular fragments such as $CH_3$, $CH_2$, CH, $NH_2$, and NH. Other active species are known in the art, and are within the capacity of a skilled technician. Dielectric barrier discharges may take on a variety of forms, ranging from a patterned (i.e. filamentary pattern) to a regular and apparently homogeneous pattern (14, 15).

Dielectric Barrier Discharge Torches are classified as being non-thermal (i.e. non-equilibrium systems) or cold plasma systems. Thermal plasmas have electrons and the heavy particles at the same temperature (i.e. they are in thermal equilibrium with each other). However, non-thermal plasmas are typically characterized as comprising ions and neutrals (heavy particles) at lower temperatures than the electrons. Since the temperatures of the heavy particles in the plasma remain relatively low, avoiding any unwanted polymer decomposition, Dielectric Barrier Discharge Torches have been described as being suitable for polymerization and deposition processes. An intrinsic advantage of Dielectric Barrier Discharge Torches over other conventional thermal plasma torches is that non-thermal plasma conditions can be readily established at or near atmospheric pressures (i.e. atmospheric pressures or soft vacuum conditions). Operating at above or near atmospheric pressure provides for the further advantage of not requiring any expensive and difficult to maintain vacuum equipment, especially when operating in dusty environments.

Typical examples of industrial applications comprising dielectric barrier discharge technology include ozone generators and plasma display panels (15-17). Operating frequencies typically range from line frequency to several GHz, more typically from 1 kHz to 500 kHz.

The Dielectric Barrier Discharge Torch of the present disclosure operates at atmospheric pressures or soft vacuum conditions and can be readily integrated into a powder production process. In accordance with an embodiment of the present disclosure, an electrical discharge is initiated in the annular space between two concentric cylindrical quartz (i.e. fused silica, quartz glass), or ceramic tubes (Example FIG. 2a). In accordance with an embodiment of the present disclosure, an electrical discharge is initiated between a pair of coaxial sleeve electrodes disposed on the surface of a cylindrical dielectric tube (e.g. quartz or ceramic tube). In accordance with a further embodiment of the present disclosure, an electrical discharge is initiated in a cylindrical quartz or ceramic tube between a pair of semi-cylindrical shell electrodes. Ceramic tubes are especially useful as dielectric barriers. In accordance with a further embodiment of the present disclosure, an electrical discharge is initiated between two parallel quartz (i.e. fused silica, quartz glass), or ceramic plates. Other discharge configurations are within the capacity of a skilled technician.

The electrodes may be water cooled, depending on the embodiment of the Dielectric Barrier Discharge Torch assembly. Water cooled electrodes are typically used for Dielectric Barrier Discharge Torch assemblies producing micro- or nanoparticles comprising an organic coating. A water cooled electrode typically ensures good cooling of the discharge and test reproducibility.

In accordance with an embodiment of the present disclosure, the outer ground electrode typically comprises a metal plate or foil, a metal wire mesh or a metallic paint (e.g. platinum) applied to the external surface of the outer quartz or ceramic tube (in the case of a coaxial configuration) and burned at a temperature of at least 700° C. In accordance with a further embodiment of the present disclosure, the outer ground electrode typically comprises a metal plate or foil, a metal wire mesh or a metallic paint (e.g. platinum) applied to the external surface of the parallel transparent quartz or ceramic plates (in the case of a parallel configuration) and burned at a temperature of at least 700° C. The use of a wire mesh provides for the advantage of transparency, but occasionally introduces additional discharges between the mesh and the outer quartz or ceramic tube (in the case of a coaxial configuration) or between the mesh and the parallel plates. The use of a metallic paint (e.g. platinum) prevents such additional discharges and provides for a more uniform discharge. The metallic paint may be applied in a variety of patterns, non-limiting examples of which include a continuous pattern, a helical pattern or a ring-shaped pattern. Other patterns are within the capacity of a skilled technician. In accordance with an embodiment of the present disclosure, the metallic paint is a platinum paint. Other metallic paints, not limited to conducting paints such as gold or silver are known in the art, and are within the capacity of a skilled technician. The application of a particular metallic paint pattern or paint patterns provides for control over the trajectory taken by the powders as well as for control of the charging and coating of the powders.

It is believed that powder particles passing through the plasma region undergo charging of the same sign. The powder particles will thus repel each other, breaking-up already existing agglomerates and avoiding the formation of new agglomerates. A more efficient and homogeneous particle coating is achieved by breaking-up and avoiding the formation of agglomerates. Solid particles passing through the plasma region tend to become negatively charged because electrons impact the particle surface at much higher velocity than positively charged ions. The Dielectric Barrier Discharge Torch of the present disclosure comprises a plurality of injection ports for introducing the surface treating material precursor (e.g. monomer), ensuring that the powder particles to be coated exhibit reduced powder agglomeration prior to being subjected to the coating process.

In accordance with an embodiment of the present disclosure, the Dielectric Barrier Discharge Torch may be operated in a continuous discharge mode. In accordance with a further embodiment of the present disclosure, the Dielectric Barrier Discharge Torch may be operated in an intermittent discharge mode. When operating in a continuous discharge mode, power is applied to the Dielectric Barrier Discharge Torch without interruption, so as to sustain the discharge. When operating in an intermittent discharge mode, power is applied to the Dielectric Barrier Discharge Torch on a periodic basis (i.e. switched on and off). The time delay between successive ignitions may be short, of the order of a few milliseconds or, alternatively, may extend to a few seconds. The "off" period in each cycle does not need to be of the same duration as the "on" period, and may be set independently to a few milliseconds or extended to a few seconds. Both the "off" and "on" periods may be separately and independently controlled.

Operating the Dielectric Barrier Discharge Torch of the present disclosure in intermittent discharge mode provides for improved control over the coating process; by way of decreasing the energy load. Operating in intermittent discharge mode may provide for a 10-fold or higher reduction of the energy load in comparison to operating in a continuous discharge mode. Moreover, any potential damage resulting from the UV radiation emitted from the plasma will also be less severe when operating in intermittent discharge mode.

Various polymer coatings (e.g. polymer films) may be deposited using the Dielectric Barrier Discharge Torch of the present disclosure. Non-limiting examples of coating-monomers (i.e. surface treating material precursors) as contemplated by the present disclosure include acetylene, ethylene, isoprene, hexamethyldisiloxane (HMDSO), tetraethyloxysilane (TEOS), tetraethyl oxysilicane, diethyl dimethyl siloxane, 1,3-butadiene, styrene, methyl methacrylate, tetrafluoroethelyne (TFE), methane, ethane, propane, butane, pentane, hexane, cyclohexane, acetylene, ethylene, propylene, benzene, isoprene, hexamethyldisiloxane, tetraethyloxysilane, tetraethyl oxysilicane, diethyl dimethyl siloxane, 1,3-butadiene, styrene, methyl methacrylate, tetrafluoroethelyne, pyrrole, cyclohexane, 1-hexene, allylamine, acetyl acetone, ethylene oxide, glycidyl methacrylate, acetonitrile, tetrahydrofuran, ethylacetate, acetic anhydride, aminopropyl trimethoxysilane, aminopropyl triethoxysilane, triethoxyvinyl silane, loctanol, acrylic acid, ferrocene, cobaltocene, cyclooctateraen iron tricarbonyl, methyl cyclopentadienyl iron dicarbonyl, dicyclopentadienyl iron dicarbonyl dimmer, cyclopentadienyl cobalt cobatlacetylacetonate, nickel acetyleacetonate, dimethyl-(2,4-pentane-dionato) gold (III), nickel carbonyl, iron carbonyl, tin acetylacetonate, indium-acetylacetonate and indium tetramethylheptanedionate. It is to be understood that other monomers can also be used within the context of the present disclosure and are within the capacity of a skilled technician. Moreover, it is to be understood that the thickness and molecular weight of the polymer coating may vary and that the parameters controlling the thickness and/or molecular weight of the polymer coating are within the capacity of a skilled technician. In accordance with an embodiment of the present disclosure, the coating is an organic coating. In accordance with a further embodiment of the present disclosure, the coating is an inorganic coating. Non-limiting examples of inorganic coating precursors include pure metals, an oxide, nitrides, carbides or combinations thereof.

Various particles, ranging in size from the nanometer to the micron scale, may be coated using the Dielectric Barrier Discharge Torch of the present disclosure. Polymer coatings (i.e. polymer films) may be deposited by means of precursors that are either in the gaseous, liquid or solid state. Non-limiting examples of gaseous precursors include acetylene, ethylene and butadiene. Non-limiting examples of liquid precursors include isoprene, dysprosium isopropoxide, tetraoxysiloxane (TEOS), diethyldimethylsiloxane (DEDMS), hexamethyldisiloxane (HMDSO), methyl methacrylate (MMA) and pyrrole. Non-limiting examples of solid precursors for depositing a metal coating include ferrocene and cobaltocene.

FIG. 1 (a-j) illustrates block diagrams showing various configurations for the preparation of surface treated micro- and nanoparticles using a Dielectric Barrier Discharge Torch in accordance with the present disclosure. As broadly illustrated, the process comprises a powder feeding step, a charging and surface treating step, and a collecting step. The powder (i.e. micro- and/or nanoparticles) may be fed into the Dielectric Barrier Discharge Torch using a conventional powder feeder. It is to be understood that other feeding means suitable for conveying a powder-like material into a plasma torch may be used and are within the capacity of a skilled technician. In an embodiment of the present disclosure, the powder may be fed into the Dielectric Barrier Discharge Torch by means of an atomization probe. In such an embodiment the feed material comprises a liquid including a dispersed powder.

Figure 1B:
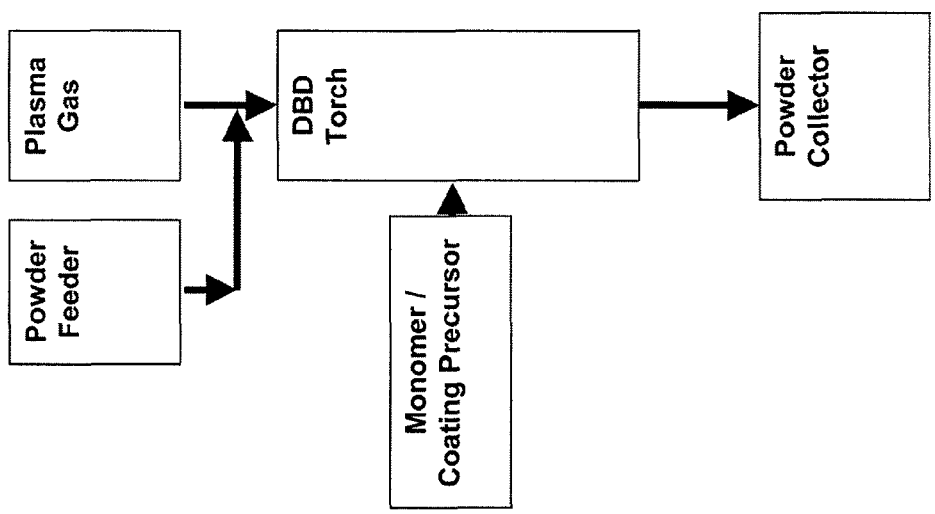

The powder-like material may be fed directly into the main discharge together with the plasma forming gas (FIG. 1a, FIG. 1c, FIG. 1d and FIG. 1e), or, alternatively, in the downstream afterglow (FIG. 1i) through one or more injection ports. In an embodiment of the present disclosure, the one or more injection ports are located in the central quartz injection tube of the Dielectric Barrier Discharge Torch. In further embodiments, the powder-like material may be fed into the Dielectric Barrier Discharge Torch at an intermediate location (FIG. 1b, FIG. 1f and FIG. 1g), or, alternatively in between successive Dielectric Barrier Discharge Torches operating in tandem (FIG. 1h). In yet further embodiments of the present disclosure, a solution comprising the powder feed material may be fed into the Dielectric Barrier Discharge Torch by means of an atomization probe (FIG. 1j). The solution comprising the powder feed material may optionally further comprise a surface treating material precursor.

Figure 1C:
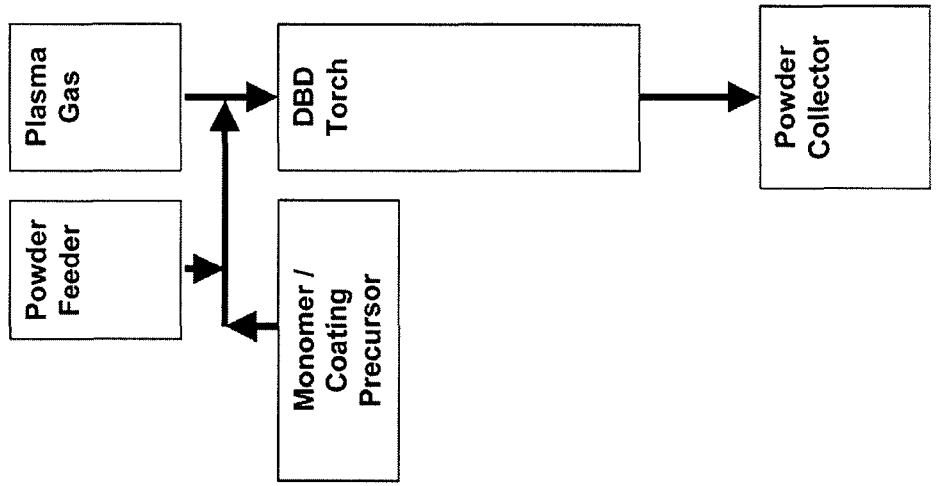

In an embodiment of the present disclosure, the monomer or coating material precursor may be injected into the main discharge together with the plasma forming gas and the powder-like material (FIG. 1c). In a further embodiment of the present disclosure, the monomer or coating material precursor may be injected into the main discharge together with the plasma forming gas (FIG. 1i). In a further embodiment of the present disclosure, the monomer or coating material precursor may be injected into the Dielectric Barrier Discharge Torch together with the powder-like material at an intermediate location (FIG. 1f). In a further embodiment of the present disclosure, the monomer or coating material precursor may be injected into the Dielectric Barrier Discharge Torch at an intermediate location separately from the powder-like material (FIG. 1d and FIG. 1g), or in between successive Dielectric Barrier Discharge Torches operating in tandem (FIG. 1e and FIG. 1h).

The monomer or coating material precursor may be in either gaseous, vapor or liquid form. In an embodiment of the present disclosure, the surface treating process takes place in the Dielectric Barrier Discharge Torch, following charging of the powder. In an embodiment of the present disclosure, the surface treating process takes place in the downstream afterglow (FIG. 1i). The surface treated powder is finally collected in a conventional powder collector or any other suitable powder collecting means.

FIG. 2 illustrates various electrode configurations for the generation of dielectric barrier discharges for the surface treatment and/or coating of micro- and nanoparticles in accordance with the present disclosure. FIG. 2a illustrates a Dielectric Barrier Discharge Torch 10 comprising a concentric electrode configuration. The pair of electrodes is separated by two concentric quartz or ceramic tubes 16. The central electrode 12 is typically connected to a high voltage source while the outer electrode 14 is typically connected to the ground potential. The plasma forming gas is injected into the annular region 18 defined by a pair of concentric cylindrical quartz or ceramic tubes 16. The plasma discharge generated by the use of a concentric electrode configuration will typically comprise an annular shape. FIG. 2b illustrates a Dielectric Barrier Discharge Torch 20 comprising a co-axial electrode configuration. The pair of electrodes comprises a cylindrical conductor and are co-axially disposed on the outer surface of a quartz or ceramic tube 26. One of the electrodes 22 is typically connected to a high voltage source while the second electrode 24 is typically connected to the ground potential. The plasma forming gas is injected into the cylindrical volume 28 defined by the quartz or ceramic tube 26. The plasma discharge generated by the use of a co-axial electrode configuration will fill the cylindrical volume of the quartz or ceramic tubes 26. FIG. 2c illustrates a Dielectric Barrier Discharge Torch 30 comprising a shell-type electrode configuration. The shell electrode 32 comprises a pair of semi-cylindrical electrodes 34 and 36. In an embodiment of the present disclosure, the semi-cylindrical electrodes comprise a pair of metal sheets disposed on the outer surface of a quartz or ceramic tube 36. It is to be understood that other conducting electrode materials can also be used within the context of the present disclosure and are within the capacity of a skilled technician. One of the semi-cylindrical electrodes 34 is typically connected to a high voltage source while the second semi-cylindrical electrode 36 is typically connected to the ground potential. The plasma forming gas is injected into the cylindrical volume 39 defined by the quartz or ceramic tube 36. It is to be understood that multiple pairs of semi-cylindrical electrodes may be disposed on the outer surface of a quartz or ceramic tube 36. FIG. 2d illustrates a Dielectric Barrier Discharge Torch 40 comprising a multiple shell-type electrode configuration. Dielectric Barrier Discharge Torch 40 comprises two pairs of shell-type electrodes 42 and 44 disposed in a staggered configuration with respect to one another. In an embodiment of the present disclosure, the semi-cylindrical electrodes comprise a pair of metal sheets disposed on the outer surface of a quartz or ceramic tube 49. It is to be understood that other conducting electrode materials can also be used within the context of the present disclosure and are within the capacity of a skilled technician. In an embodiment of the present disclosure, the pair of semi-cylindrical electrodes 42 and 44 is staggered by 90 degrees with respect to each other. It is to be understood that other staggering angles can also be used within the context of the present disclosure and are within the capacity of a skilled technician. Semi-cylindrical electrodes 41 and 45 are typically connected to a high voltage source while the semi-cylindrical electrode 43 and 46 are typically connected to the ground potential. The plasma forming gas is injected into the cylindrical volume 48 defined by the quartz or ceramic tube 49. A staggering angle of 90 degrees between the pair of shell-type electrodes provides for a more uniform plasma distribution within the cylindrical cavity of the quartz or ceramic tube. The electrode configurations of FIG. 2 may be either water cooled or air-cooled, depending on the power rating of the discharge.

Figure 3C:
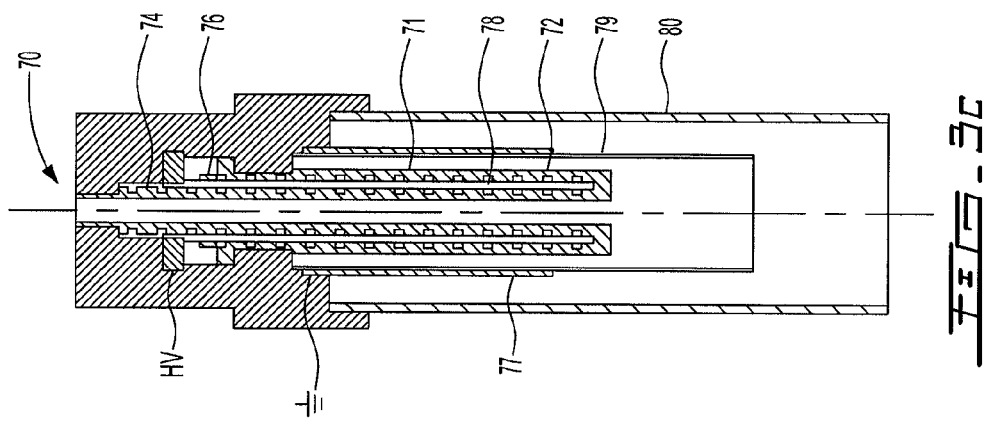
FIG. 3 shows: (a) a photograph of a Dielectric Barrier Discharge Torch assembly comprising a concentric electrode configuration in operation for producing micro- or nanoparticles either comprising and oxide layer or an organic coating, in accordance with an embodiment of the present disclosure; (b) a schematic cross-sectional elevational view of a Dielectric Barrier Discharge Torch assembly in accordance with the present disclosure; and (c) a schematic cross-sectional elevational view of a torch head illustrating the central powder or surface treating material precursor injection probe and the high voltage and ground electrodes.
Figure 3B:
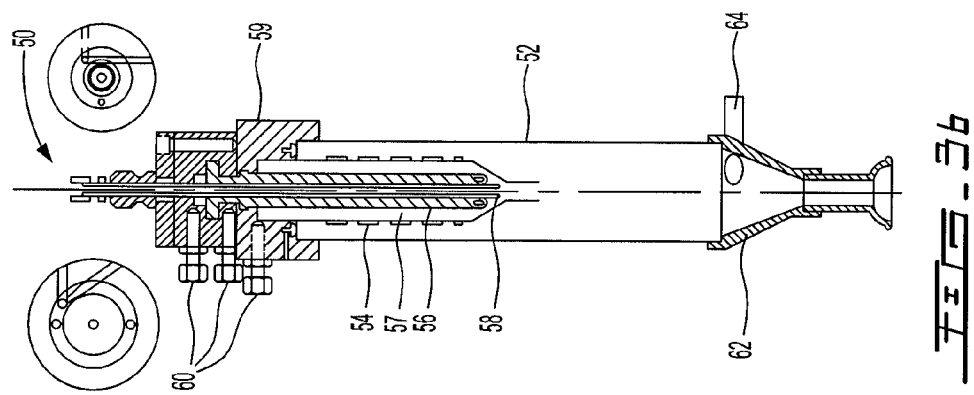
Figure 3A:
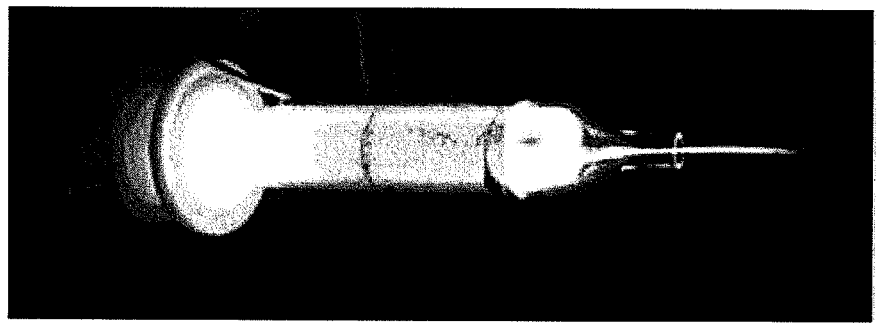

FIG. 3b shows a schematic cross-sectional elevational view of a Dielectric Barrier Discharge Torch assembly 50 in accordance with the present disclosure. Assembly 50 comprises a central body portion comprising an outer quartz tube 52 in which is located at least one ground electrode 54 as well as a high voltage electrode 56. An alternating high voltage current having a frequency of about 20 kHz is typically applied to the high voltage electrode. In an embodiment of the present disclosure, the applied voltage typically ranges from about 5 to about 15 kV. The assembly of FIG. 3b is typically used for producing micro- or nanoparticles either comprising and oxide layer or an organic coating. In an embodiment of the present disclosure, the high voltage electrode 56 may be water cooled. An annular discharge gap 57 defines the space between the at least one ground electrode 54 and the high voltage electrode 56. The discharge is ignited in the annular discharge gap (i.e. the space between the ground electrode(s) and the high voltage electrode). In an embodiment of the present disclosure, the discharge gap may be defined by the space between a pair of quartz tubes, or parallel quartz plates located within the torch body. A central injection tube 58 extends substantially coaxially within the high voltage electrode 56. In an embodiment of the present disclosure, the central injection tube 58 may be configured to be of adjustable length. The Dielectric Barrier Discharge Torch assembly 50 further comprises a torch body 59 through which extends the central injection tube 58, the torch body being operatively affixed to an upper end of the quartz tube 52 and comprising a plurality of openings 60, configured to receive the plasma gas feed, optionally a sheath gas feed, the water inlet and outlet (i.e. in the case of a water cooled high voltage electrode) and ground and high voltage connections.

A powder collection chamber 62, optionally comprising one or more tangential injection ports 64, is positioned at a lower end of the quartz tube 52 for receiving the surface treated powder. In an embodiment of the present disclosure, the powder collection chamber 62 is coaxially mounted to the lower end of the quartz tube 52, substantially at the exit of the plasma discharge. The atmosphere at the exit of the discharge (i.e. area immediately above the powder collection chamber 62) may be controlled by the injection of an inert or active gas through the one or more tangential injection ports 64.

In an embodiment of the present disclosure, the Dielectric Barrier Discharge Torch comprises interchangeable quartz or ceramic tubes, providing for varying discharge gap configurations. Discharge gaps having a radial width ranging from about 1 mm to about 10 mm may be generated. Higher discharge gaps are within the capacity of a skilled technician. The length of the discharge is governed by the length of the outer ground electrode (concentric and shell-type configurations). In the case of the coaxial configuration, the length of the discharge is governed by the length of the high voltage electrode, the ground electrode and the gap therebetween. In the case of the multi-shell electrode configuration, the length of the discharge is governed by the length of the shell-type electrodes and the gap therebetween. In a further embodiment of the present disclosure, the Dielectric Barrier Discharge Torch comprises a pair of parallel quartz plates (i.e. concentric configuration) separated by a gap width ranging from about 1 mm to about 10 mm. Higher gap widths between the parallel plates are within the capacity of a skilled technician.

In accordance with an embodiment of the present disclosure, the outer ground electrode typically comprises a metal plate or foil, a metal wire mesh or a metallic paint (e.g. platinum) applied to the external surface of the outer quartz or ceramic tube (e.g. coaxial configuration). The metallic paint may be applied in a variety of patterns and shapes, non-limiting examples of which include a continuous pattern, a helical pattern or a ring-shaped pattern.

With reference to FIG. 3b, the central injection tube 58, extending substantially coaxially within the high voltage electrode 56 may be of adjustable height so that location of the injection of the powder-like material and/or the monomer into the Dielectric Barrier Discharge Torch may be controlled (i.e. either directly into the main discharge together the main gas flow, at some intermediate location or at the exit of the discharge gap). In an embodiment of the present disclosure, the Dielectric Barrier Discharge Torch comprises an outer tube 52 separating the exit of the discharge from the atmosphere. Such a configuration provides for the introduction of an additional gas, typically a noble gas.

FIG. 3c shows an illustrative embodiment of a cooling circuit for the high voltage electrode of Dielectric Barrier Discharge Torch 70. In this particular embodiment, in the cooling system is completely sealed within a stainless steel cylinder 71 positioned within the inner quartz tube 72 of the Dielectric Barrier Discharge Torch 70. The water inlet and outlet are denoted by numerals 74 and 76 respectively. The high voltage and ground electrodes are denoted by numerals 77 and 78 respectively. A pair of outer coaxial quartz tubes is denoted by numerals 79 and 80. The intermediate quartz tube 79 act as a dielectric. The outer quartz tube 80 isolates the discharge from the atmosphere. The cooling configuration ensures efficient cooling of the high voltage electrode and the discharge gap such that the application of high voltage currents is possible without reaching typical high plasma temperatures (cold plasma). In an embodiment of the present disclosure, the cooling system operates by means of water as the coolant. In yet a further embodiment of the present disclosure, the cooling system comprises a closed system operating by means of deionized water as the coolant. Other coolants (i.e. synthetic oil or polyols) are known in the art, and are within the capacity of a skilled technician. Higher plasma discharge temperatures may be achieved by means of synthetic oil as the coolant for the high voltage electrode. Higher plasma discharge temperatures provide for the polymer coating of powders using a monomer starting material (i.e. coating precursor) requiring higher vaporization temperatures while concomitantly avoiding condensation of the monomer starting material in the injection tube.

FIG. 4 (a-b) shows an illustrative embodiment of a Dielectric Barrier Discharge Torch assembly typically configured for producing an organic coating on metallic and/or metallic oxide micro- or nanoparticles. Such a configuration may also be used to produce inorganic coatings. The Dielectric Barrier Discharge Torch comprises a cooling system that is completely sealed and positioned within a double walled quartz tube.

FIG. 4c shows a schematic cross-sectional elevational view of a Dielectric Barrier Discharge Torch assembly 90 comprising a water cooled multiple-staggered shell electrode configuration in accordance with an embodiment of the present disclosure. The Dielectric Barrier Discharge Torch assembly 90 includes an upstream module 92 comprising a pair of concentric quartz tubes 94 and 96. One of the electrodes is connected to a high voltage source while the other electrode is connected to the ground potential. A plasma forming gas is introduced into the discharge cavity by means of injection port 98. The plasma is generated within quartz tube 96, in between a pair of semi-cylindrical electrodes making-up a first shell electrode and disposed on the surface of quartz tube 96. Section 100 defines a gap separating upstream module 92 from downstream module 102. Downstream module 102 comprises a further shell electrode of identical construction as the first shell electrode but disposed in a staggered configuration relative thereto. The plasma discharges into chamber 104, disposed downstream from module 102. Chamber 104 comprises an injection port 106 for the introduction of a powder transport gas. The transport gas ensures the transport of the particulate product to a collection module through port 108. Both modules 92 and 102 are provided with water cooling channels (not shown) disposed in the annular space between concentric quartz tubes 94 and 96. The water is introduced by means of injection port 112 and exits through port 110. The micro- and/or nanoparticles may be fed into Dielectric Barrier Discharge Torch assembly 90 with the plasma forming gas through injection port 98. The surface treating material may be fed into Dielectric Barrier Discharge Torch assembly 90 trough port 114 disposed between modules 92 and 102. Injection port 110 provides for the introduction of additional plasma gas, or alternatively wall sheath gas. It is to be understood that Dielectric Barrier Discharge Torch assembly 90 can be modified without departing from its spirit and nature, and that such modifications are within the capacity of a skilled technician.

Figure 5:
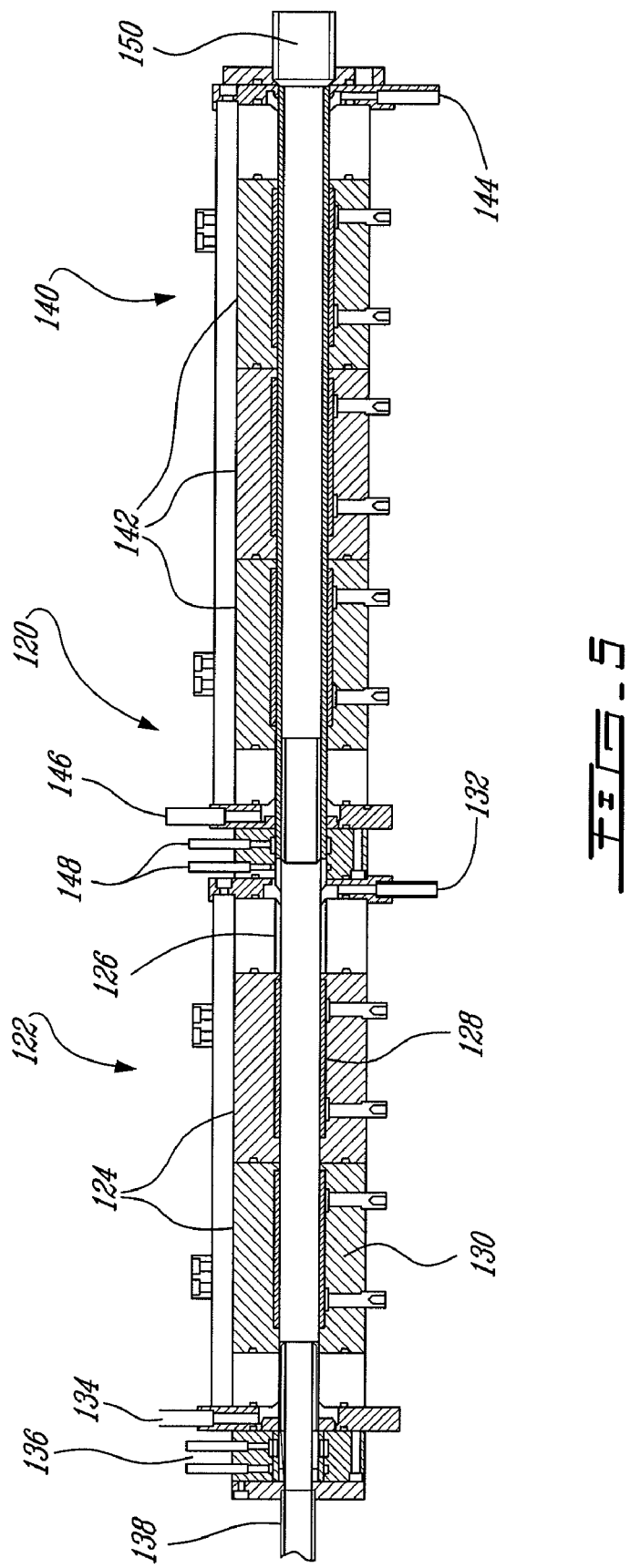
FIG. 5 shows a schematic cross-sectional elevational view of a Dielectric Barrier Discharge Torch assembly comprising multiple water-cooled shell-electrodes, in accordance with an embodiment of the present disclosure. The assembly includes an upstream section comprising a pair of modules configured for charging the micro- or nanoparticles and downstream section comprising a series of modules configured for coating the charged micro- or nanoparticles.
Figure 6C:
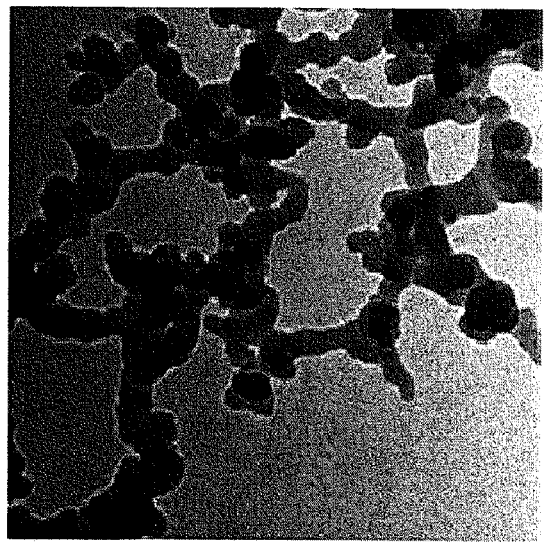
FIG. 6 (a-c) shows powder Transmission Electron Microscope (TEM) micrographs of nano-silica particles.
Figure 6B:
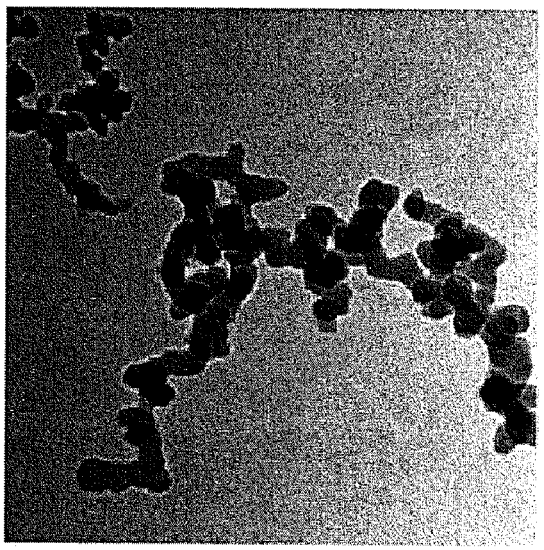
Figure 6A:
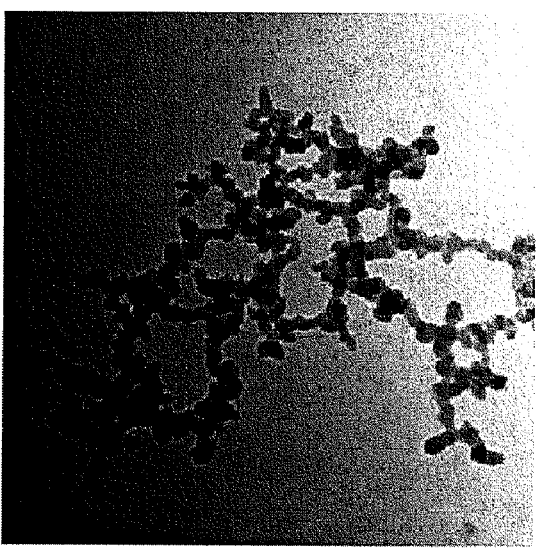
Figure 7C:
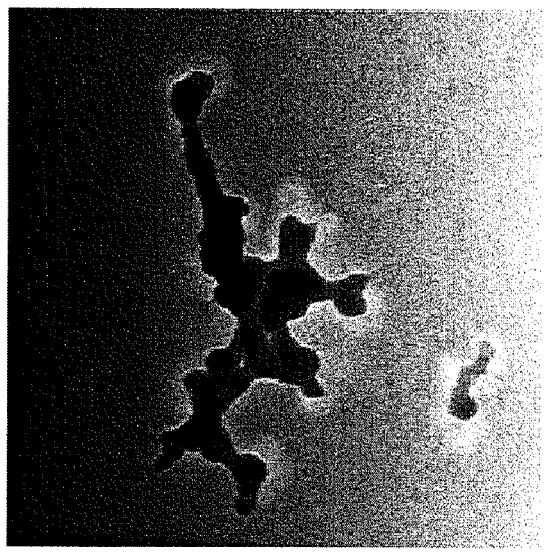
FIG. 7 (a-c) shows Transmission Electron Microscope (TEM) micrographs of polyethylene coated nano-silica particles produced using a Dielectric Barrier Discharge Torch assembly in accordance with an embodiment of the present disclosure and, showing a substantially homogeneous polyethylene coating having a thickness of about 10 nm.
Figure 7B:
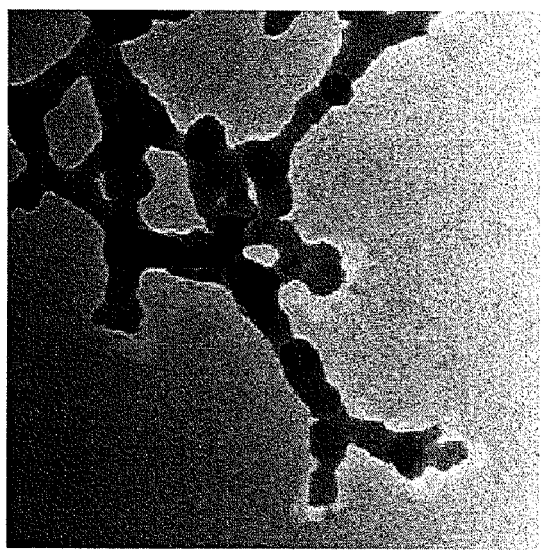
Figure 7A:
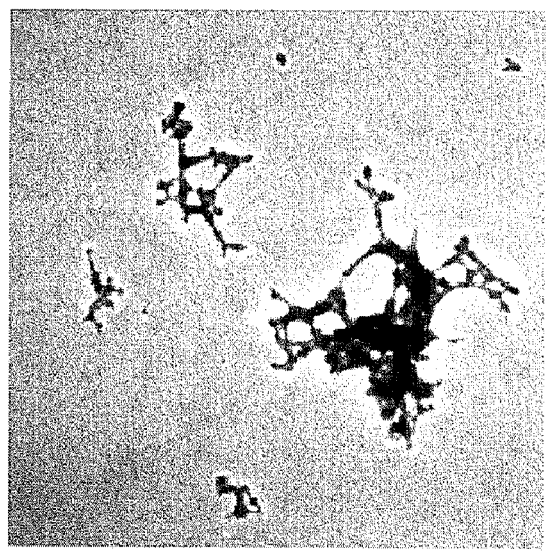
Figure 8B:
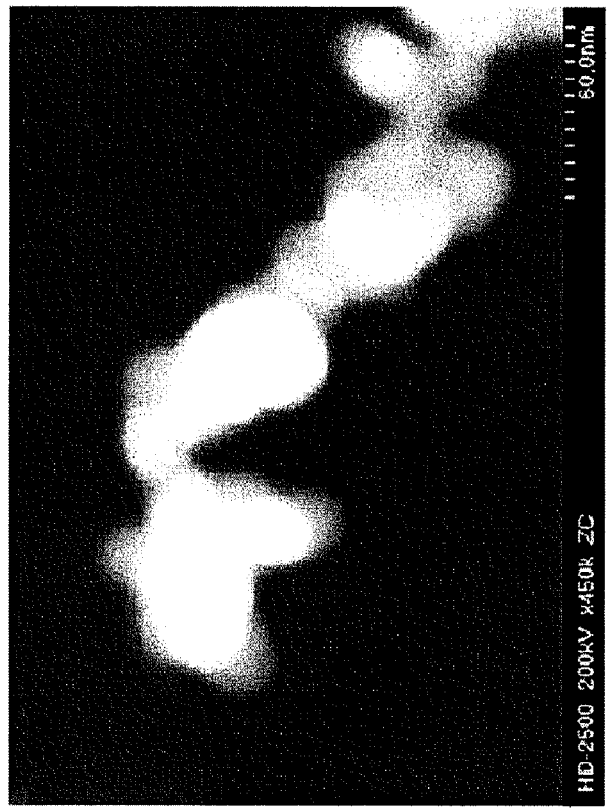
FIG. 8 (a-b) shows Transmission Electron Microscope (TEM) micrographs of polyisoprene coated nano-silica particles produced using a Dielectric Barrier Discharge Torch assembly in accordance with an embodiment of the present disclosure and, showing a substantially homogeneous polyisoprene coating having a thickness of about 5 nm.
Figure 8A:
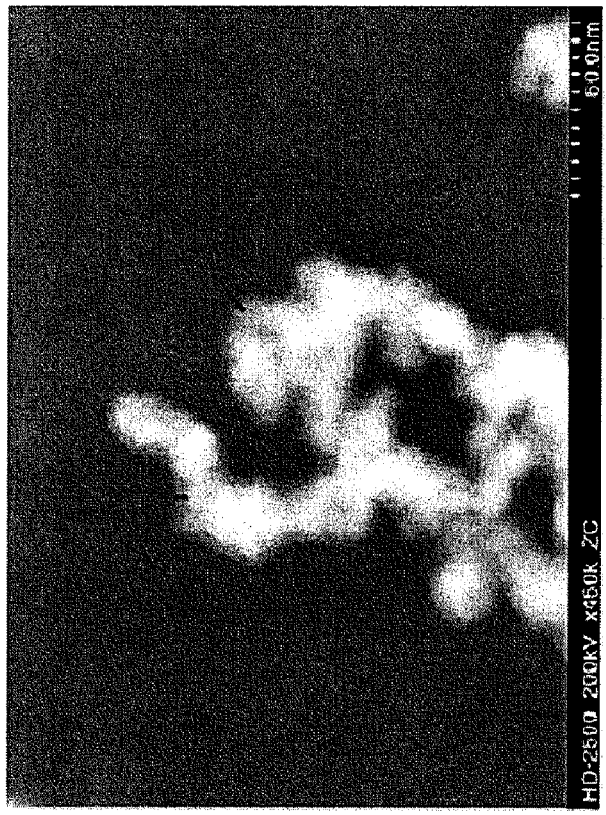
Figure 9B:
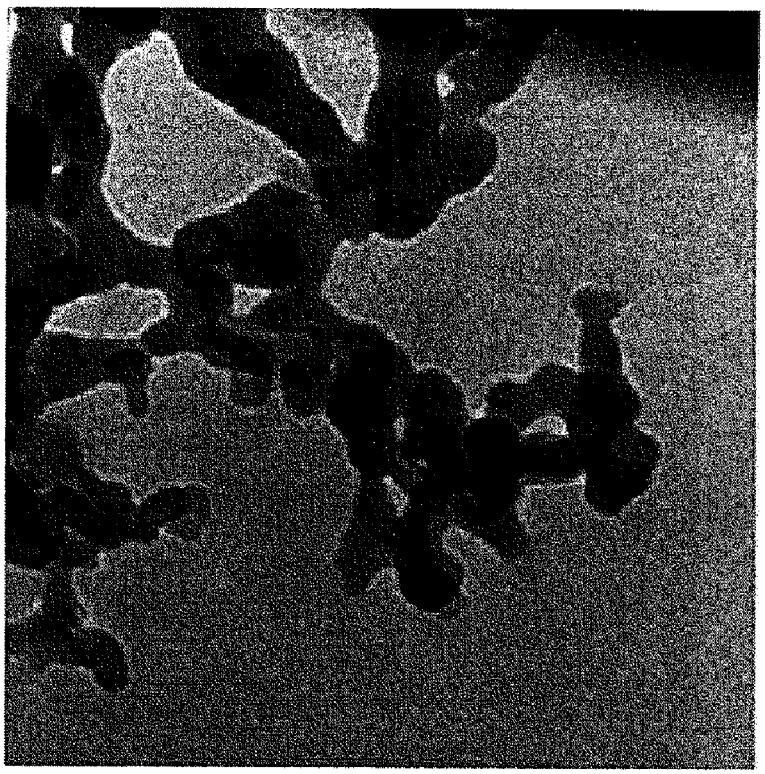
FIG. 9 (a-b) shows Transmission Electron Microscope (TEM) micrographs of polybutadiene coated nano-silica particles produced using a Dielectric Barrier Discharge Torch assembly in accordance with an embodiment of the present disclosure and, showing a substantially homogeneous polybutadiene coating having a thickness of about 5 nm.
Figure 9A:
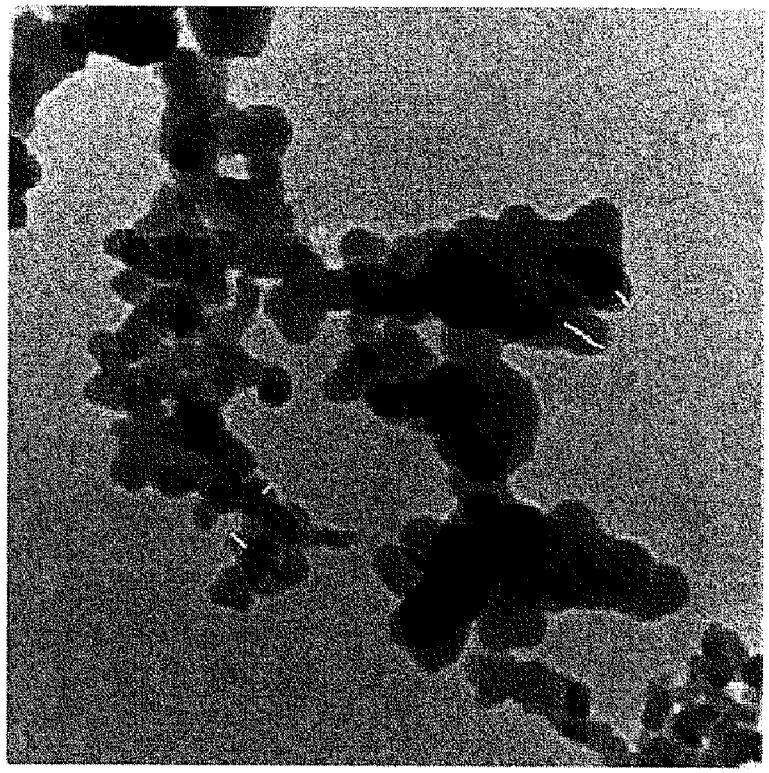
Figure 10C:
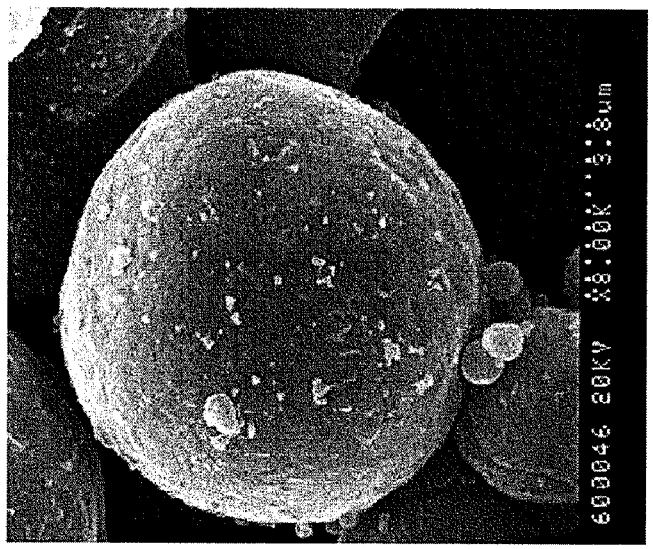
FIG. 10 (a-c) shows Scanning Electron Microscope (SEM) micrographs of macro-aluminum metallic particles.
Figure 10B:
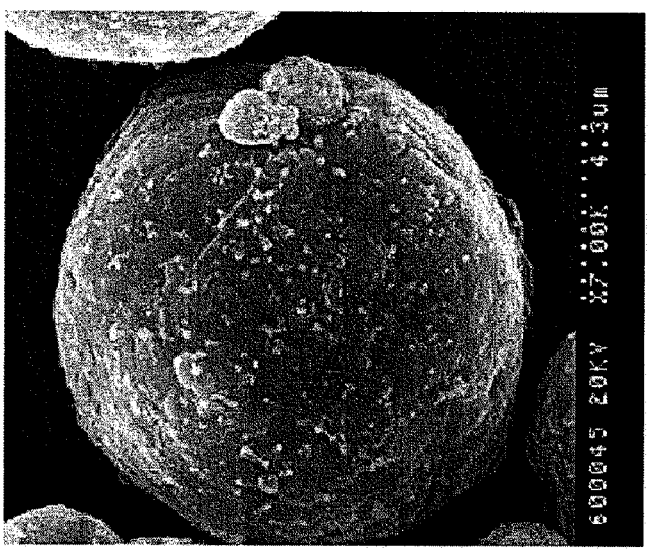
Figure 10A:
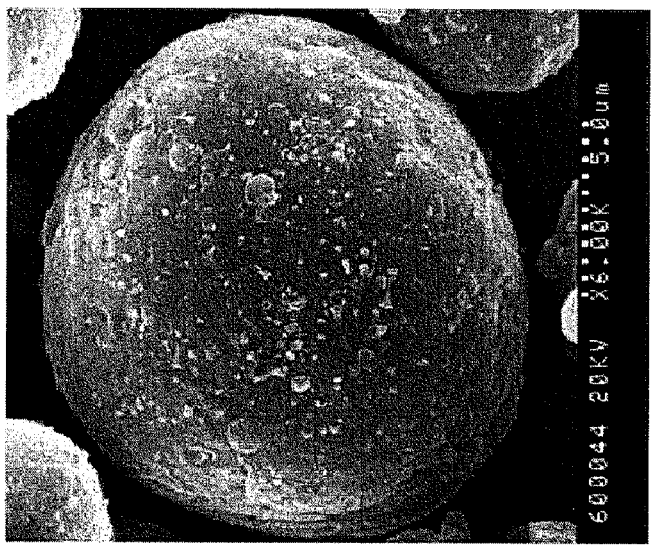
Figure 11C:
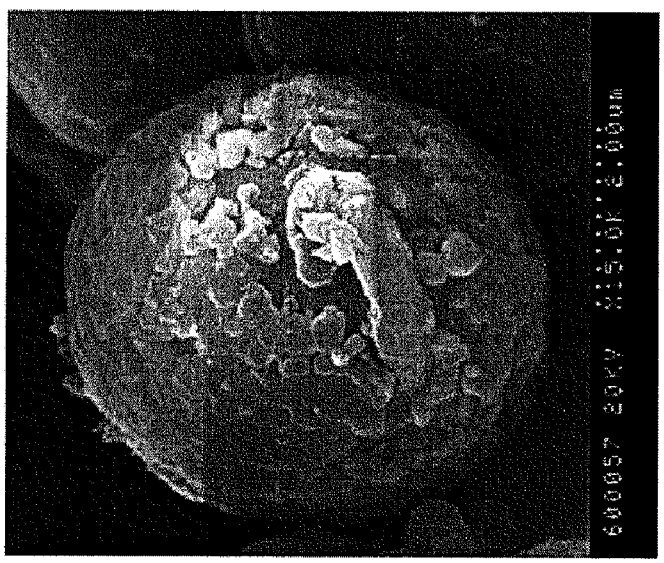
FIG. 11 (a-c) shows Scanning Electron Microscope (SEM) micrographs of macro-aluminum particles comprising a silica like ($SiO_xC_yH_z$) coating (tetraethyl oxysilane was the coating precursor), produced using a Dielectric Barrier Discharge Torch assembly in accordance with an embodiment of the present disclosure and, showing a substantially homogeneous silica like coating.
Figure 11B:
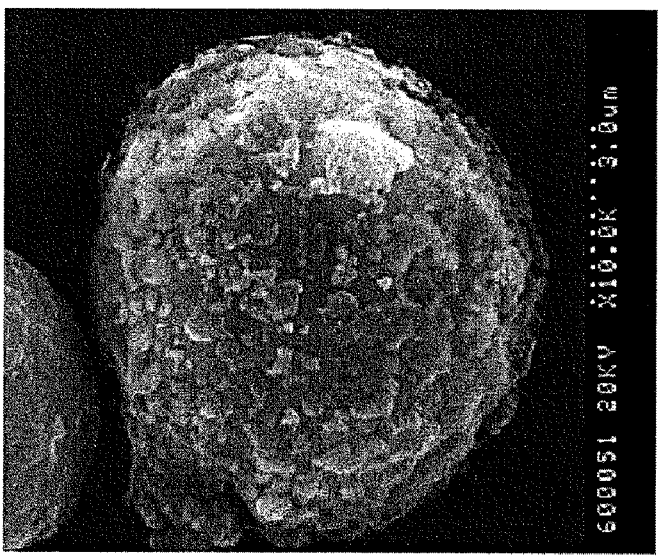
Figure 11A:
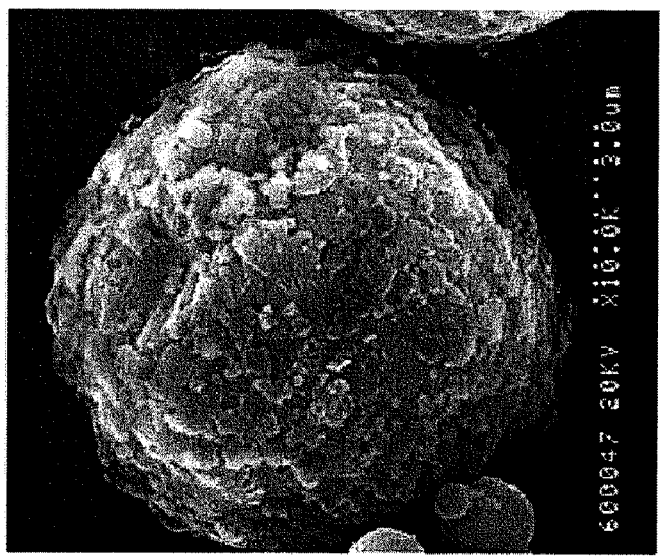
Figure 12B:
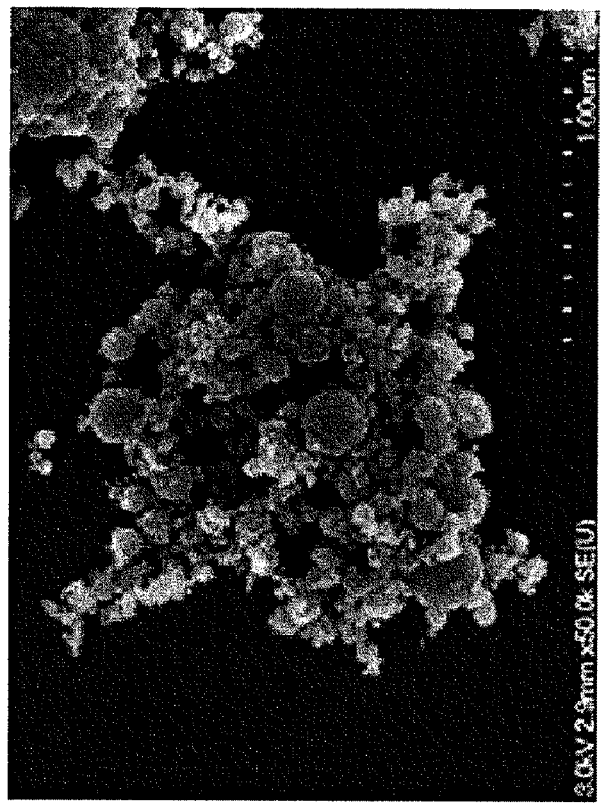
FIG. 12 (a-b) shows Field Emission Gun (FEG) Microscope micrographs of nano-aluminum particles.
Figure 12A:
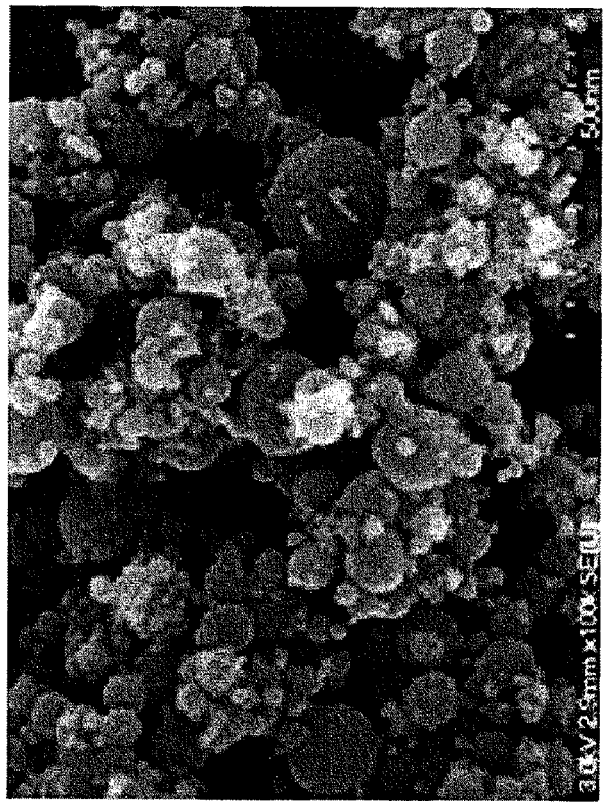
Figure 13B:
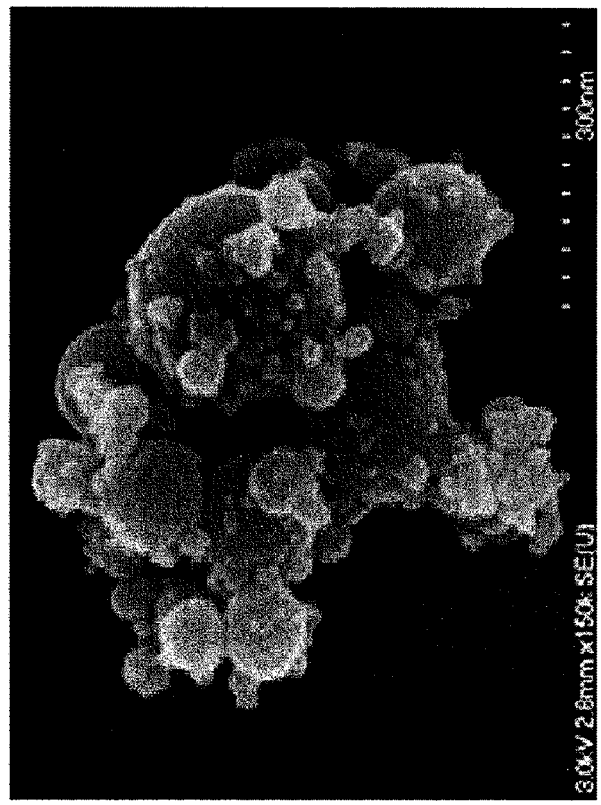
FIG. 13 (a-b) shows Field Emission Gun (FEG) Microscope micrographs of nano-aluminum particles comprising a silica like ($SiO_xC_yH_z$) coating (diethyl dimethyl siloxane was the coating precursor), produced using a Dielectric Barrier Discharge Torch assembly in accordance with an embodiment of the present disclosure and, showing a substantially homogeneous silica like coating.
Figure 13A:
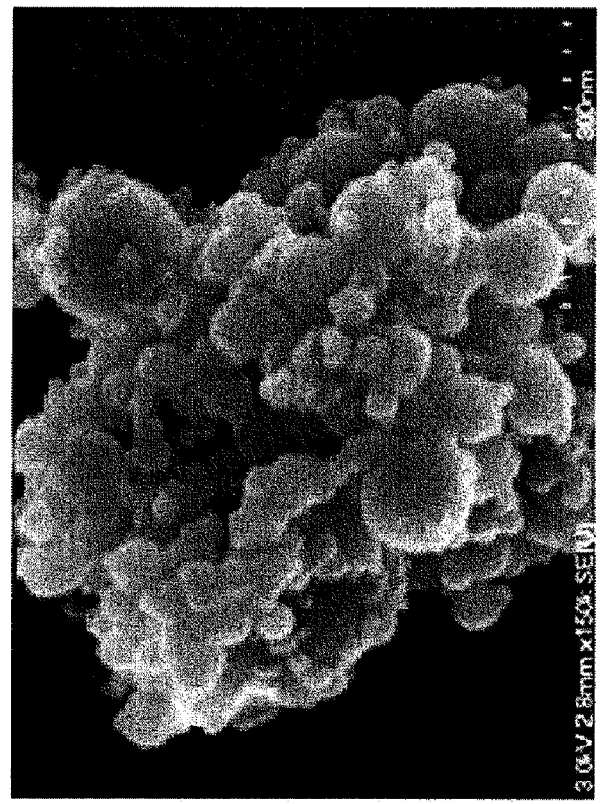
Figure 14B:
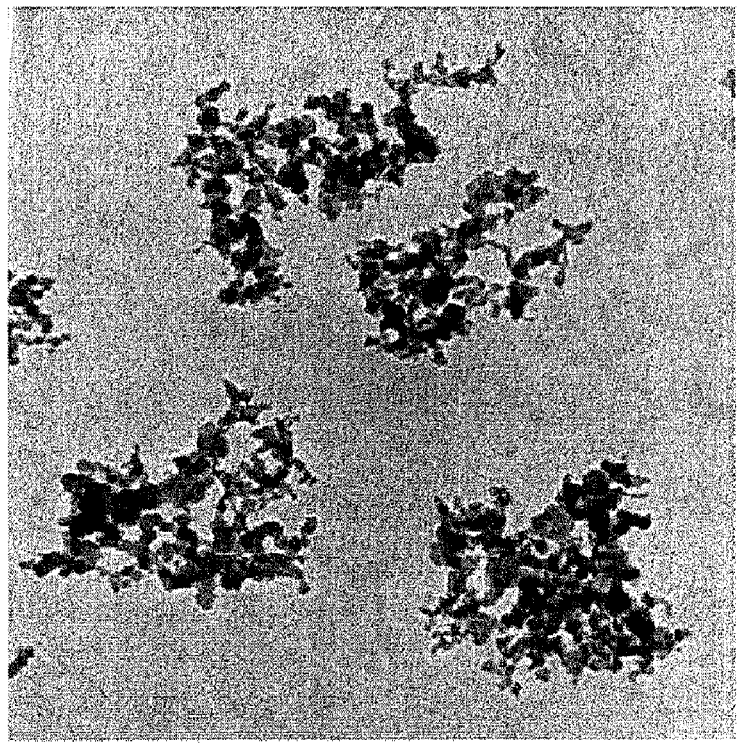
FIG. 14 (a-b) shows Transmission Electron Microscope (TEM) micrographs of nano-alumina particles.
Figure 14A:
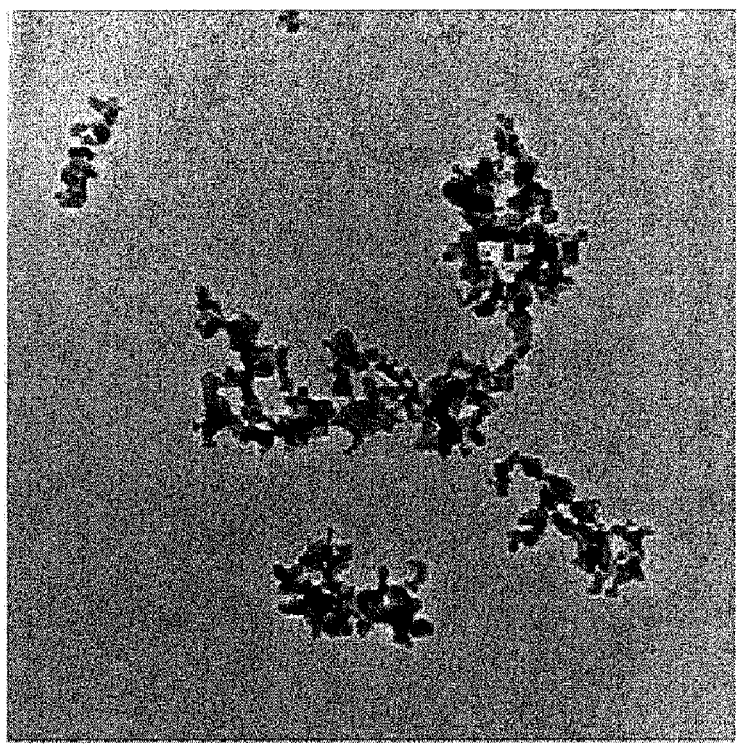
Figure 15B:
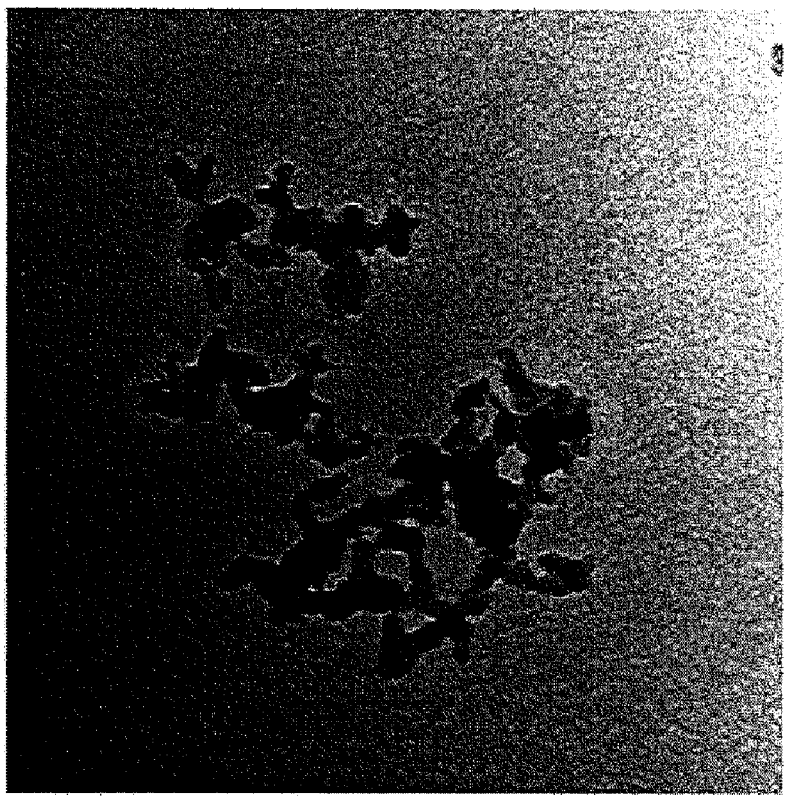
FIG. 15 (a-b) shows Transmission Electron Microscope (TEM) micrographs of nano-alumina particles comprising a silica like ($SiO_xC_yH_z$) coating (diethyl dimethyl siloxane was the coating precursor), produced using a Dielectric Barrier Discharge Torch assembly in accordance with an embodiment of the present disclosure and, showing a substantially homogeneous silica like coating.
Figure 15A:
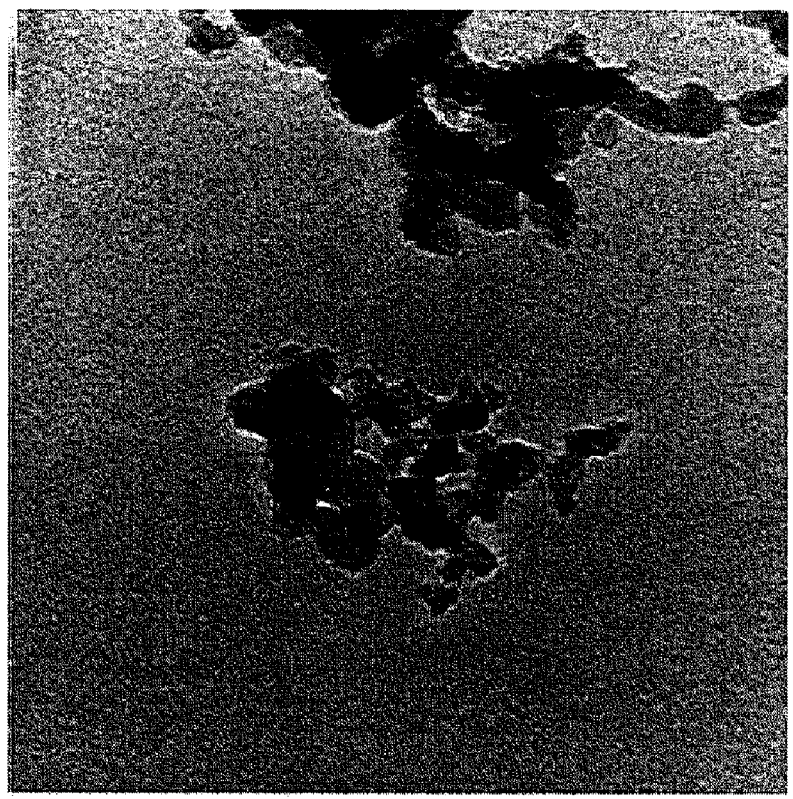
Figure 16B:
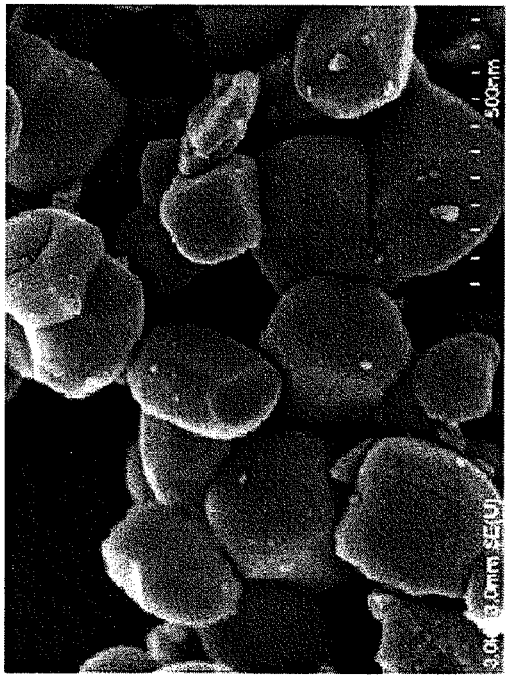
FIG. 16 (a-c) shows Field Emission Gun (FEG) micrographs of nano-barium titanate particles.
Figure 16C:
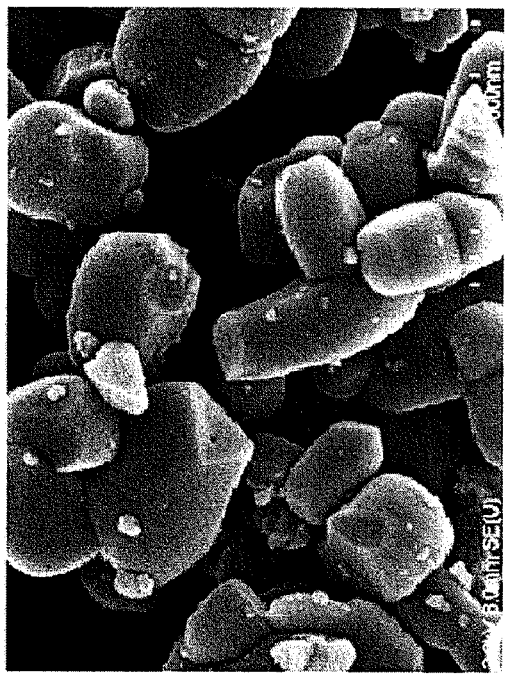
Figure 16A:
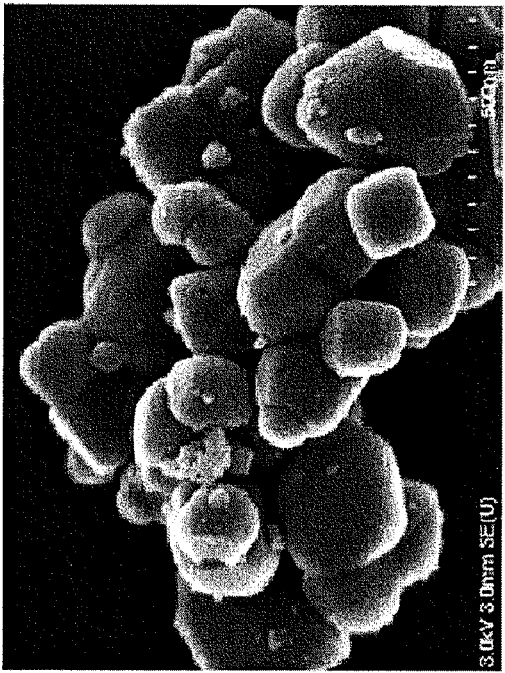
Figure 17B:
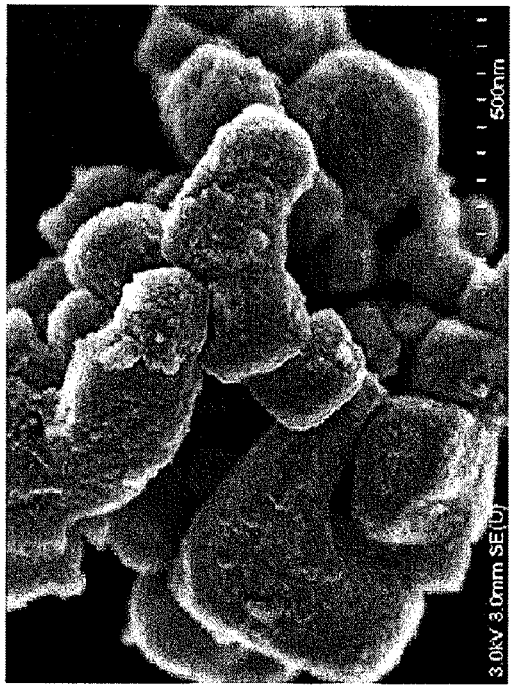
FIG. 17 (a-c) shows Field Emission Gun (FEG) Microscope micrographs of nano-barium titanate particles comprising a dysprosium oxide ($Dy_2O_3$) inorganic coating produced using a Dielectric Barrier Discharge Torch assembly in accordance with an embodiment of the present disclosure and, showing a substantially homogeneous dysprosium oxide coating.
Figure 17C:
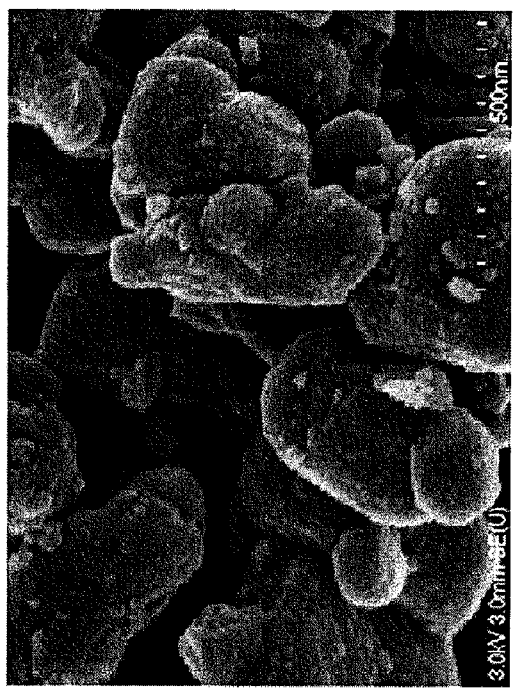
Figure 17A:
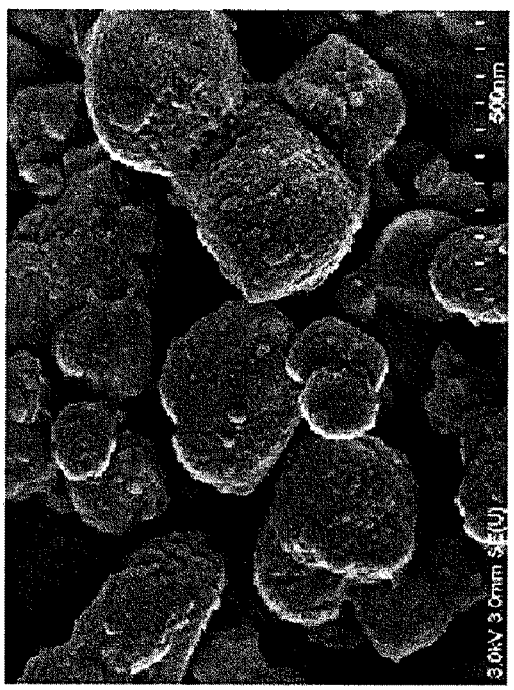
Figure 18C:
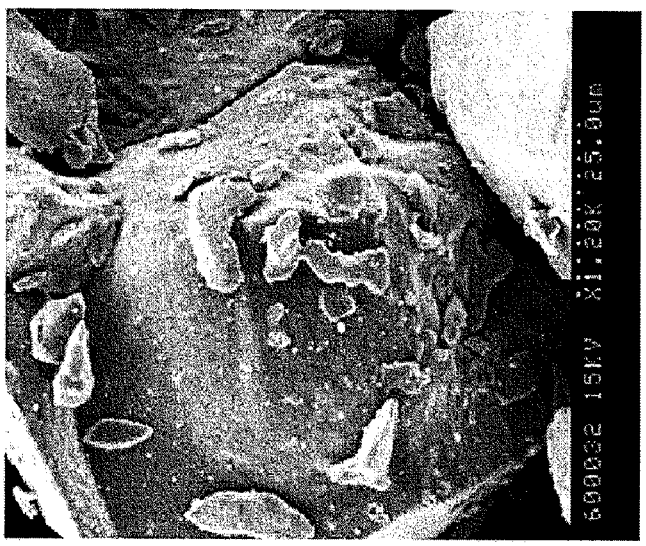
FIG. 18 (a-c) shows Scanning Electron Microscope (SEM) micrographs of magnetic macro-metallic particles.
Figure 18B:
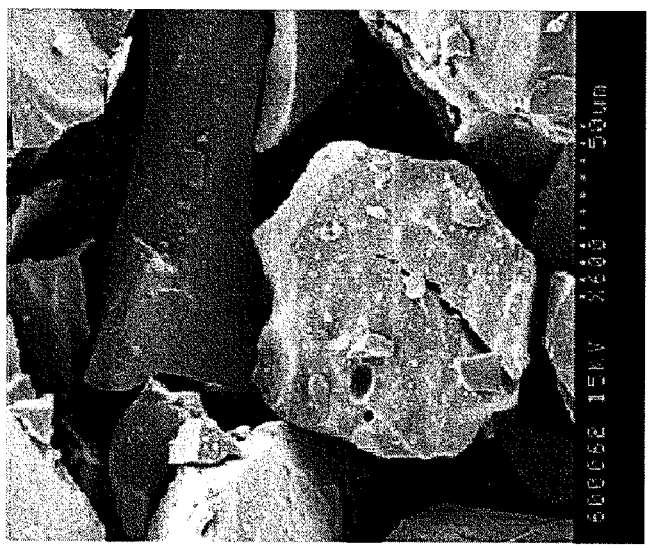
Figure 18A:
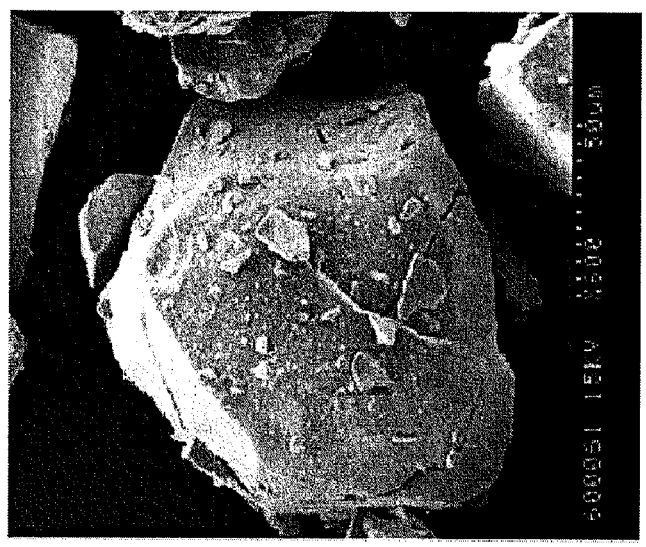
Figure 19C:
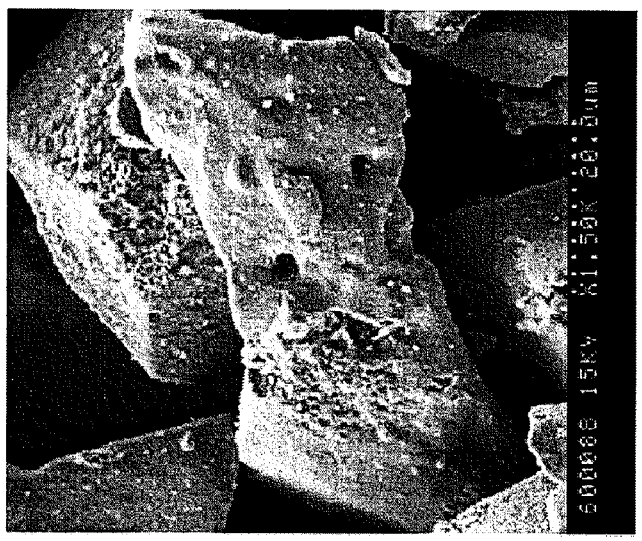
FIG. 19 (a-c) shows Scanning Electron Microscope (SEM) micrographs of magnetic macro-metallic particles comprising an iron like coating (ferrocene was the coating precursor), produced using a Dielectric Barrier Discharge Torch assembly in accordance with an embodiment of the present disclosure and, showing a substantially homogeneous iron like coating.
Figure 19B:
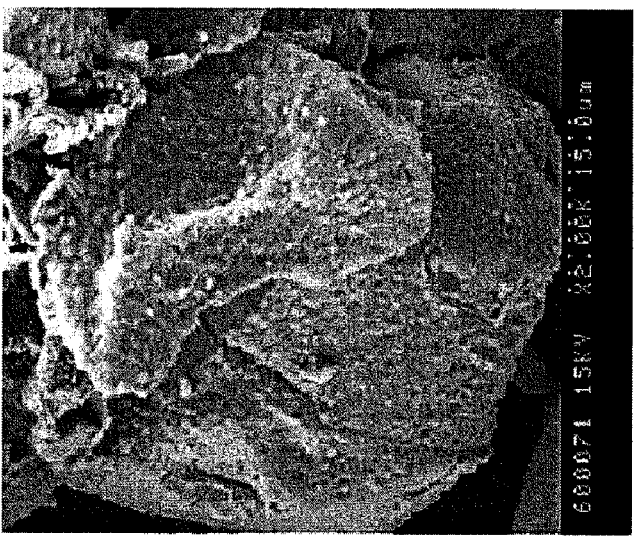
Figure 19A:
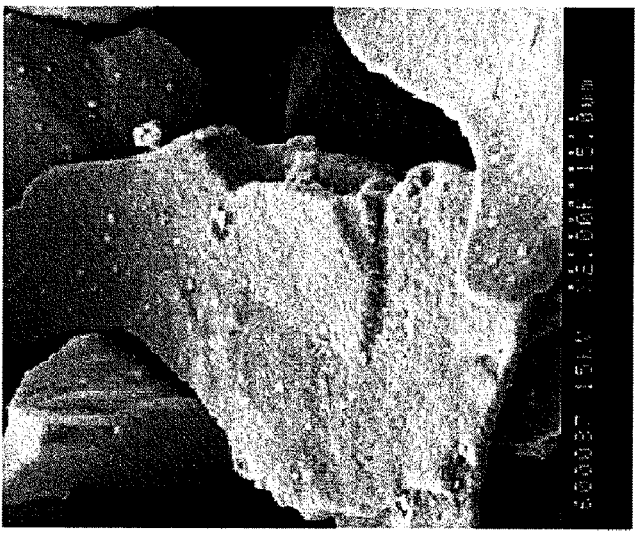
Figure 20:
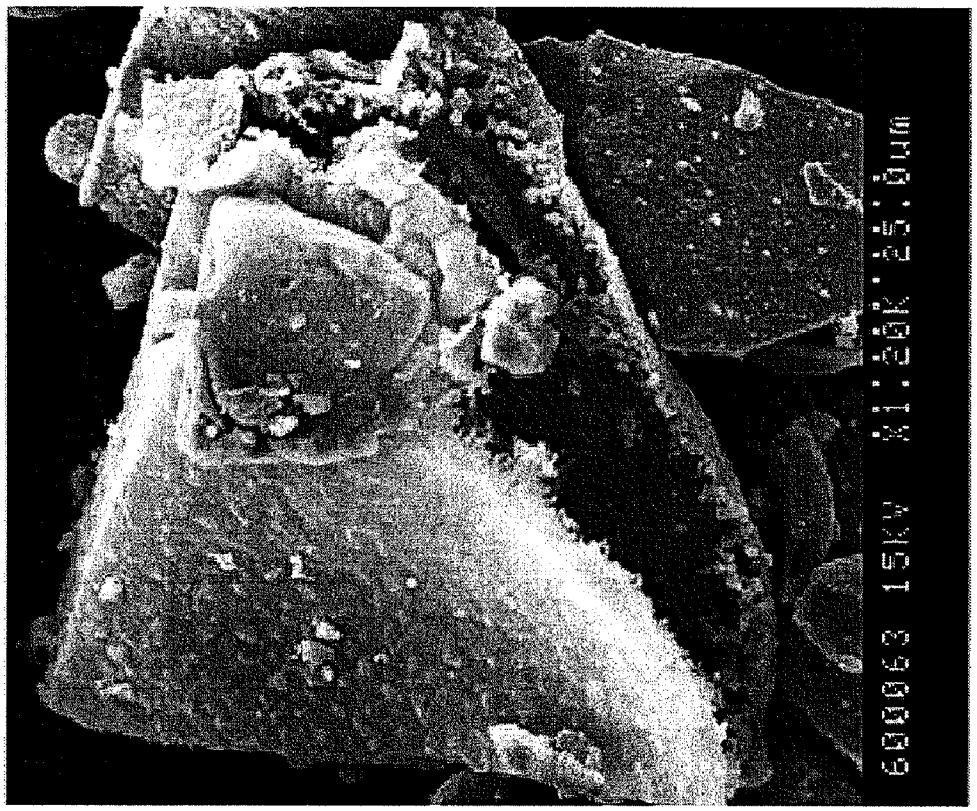
FIG. 20 shows a Scanning Electron Microscope (SEM) micrograph of magnetic macro-metallic particles comprising a cobalt like coating (cobaltocene was the coating precursor), produced using a Dielectric Barrier Discharge Torch assembly in accordance with an embodiment of the present disclosure and, showing a substantially homogeneous cobalt like coating.

FIG. 5 shows a schematic cross-sectional elevational view of a Dielectric Barrier Discharge Torch assembly 120 comprising a water cooled multiple-staggered shell electrode configuration (five shell electrode modules) in accordance with an embodiment of the present disclosure. The Dielectric Barrier Discharge Torch assembly 90 includes an upstream section 122 comprising a pair of shell-electrode modules 124. The shell electrodes 128 are disposed on the surface of quartz or ceramic tube 126. Shell-electrode modules 124 are surrounded by a polymer matrix composite material 130, in which the shell electrodes 128 are imbedded. Shell-electrode modules 124 are provided with water cooling channels (not shown). The water is introduced by means of injection port 132 and exits through port 134. Injection ports 136 provide for the introduction of a sheath gas around the inside perimeter of the inner wall of the quartz or ceramic tube 126. A plasma forming gas is introduced into the discharge cavity by means of injection port 138. The micro- and/or nanoparticles may be fed into Dielectric Barrier Discharge Torch assembly 120 with the plasma forming gas through injection port 138. The Dielectric Barrier Discharge Torch assembly 120 further includes a downstream section 140 comprising three shell-electrode modules 142 of identical construction as the first pair of shell electrode modules 124, but disposed in a staggered configuration relative thereto. The shell electrodes 142 are disposed on the surface of quartz or ceramic tube 126 and are provided with water cooling channels (not shown). The water is introduced by means of injection port 144 and exits through port 146. Injection ports 148 provide for the introduction of a further sheath gas around the inside perimeter of the inner wall of the quartz or ceramic tube 126. The plasma discharge enters a collection module (not shown) through exit port 150. The use of a multiple shell electrode module configuration provides for process flexibility since the number of modules may be either increased or reduced depending on the process requirements. In an embodiment of the present disclosure, the upstream section 122 may be used exclusively for charging the micro- and/or nanoparticles to be surface treated, while the downstream section 140 may be used exclusively for the surface treatment. A heating tube may be positioned in an upstream location relative to section 122 to control the powder temperature, as heating is a governing parameter in particle-charging. In a further embodiment of the present disclosure, both the upstream section 122 and downstream section 140 may used for surface treating the micro- and/or nanoparticles feed material. The latter embodiment provides for extended contact times between the particle feed and the plasma discharge.

EXPERIMENTAL

A number of examples are provided hereinbelow, illustrating the efficiency of the Dielectric Barrier Discharge Torch of the present disclosure in the plasma surface treatment of micro- and/or nanoparticles.

Power Supply

In an embodiment, the power supply used in connection with the Dielectric Barrier Discharge Torch of the present disclosure was a Corona generator from 3DTSOFTAL (Polydyene 1 Corona Generator). The main characteristics of the power supply are summarized hereinbelow in Table 1.

TABLE 1

Power supply characteristics.

| | |
|---|---|
| Power (W) | 500 (Maximum) |
| Voltage (kV) | 15 |
| High Voltage Adjustment (kV) | 5-15 |
| Frequency (kHz) | ~20-25 |
| Intermittent Mode Process Time (s) | 0.2-25 |

Operating Conditions

The operation conditions of the Dielectric Barrier Discharge Torch of the present disclosure may vary, depending on the nature of the powder, the desired surface treatment, the desired coating and the surface treating material (i.e. monomer). Controlling the residence time of the surface treating material is essential for controlling the thickness of the applied film coating. Representative operating conditions are summarized hereinbelow in Table 2.

TABLE 2

Operating parameters.

| | Sheath or Plasma Gas | Powder Injection Gas | |
|---|---|---|---|
| Power (W) | He and/or monomer, Ar, $N_2$, $O_2$, Air (l/min) at STP | He and/or monomer, Ar, $N_2$, $O_2$, Air (l/min) at STP | Powder (g/min)* |
| 50 to 500 | 0.2 to 30 | 0.2 to 3 | 0.2 to 6 |

*The residence time of the powder is of the order of about 1 second.

A Tekronix digital scope (TEK TDS 1002-TDS2MEM) and a Tekronix high voltage probe (75 MHz, 40 kV) were used to monitor the voltage and the current. The current was integrated to allow for the display of voltage charge Lissajous figures, which were subsequently used to determine the discharge power (15-18). Representative electrical characteristics of the discharge are summarized hereinbelow in Table 3.

TABLE 3

Electrical discharge characteristics.

| Sample # | Power (W) | Gas temperature in the discharge gap ($T_g$ (° C.)) |
|---|---|---|
| 060310-02 | 80 | 225 |
| 060315-01 | 139 | 360 |

Coating Results for Metal and Metal Oxide Powders

Figure 21:
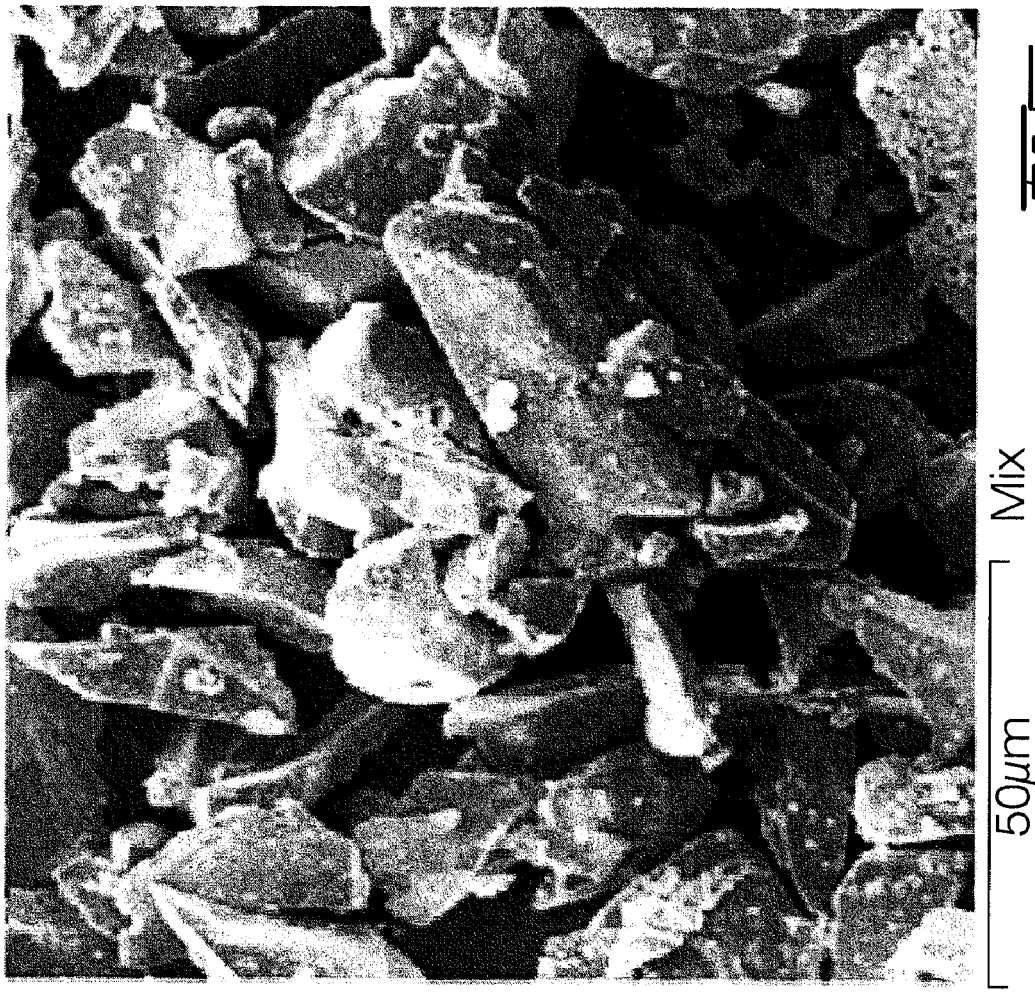
FIG. 21 shows an Energy Dispersive Spectrum (EDS) mapping of cobalt coated magnetic particles, showing (in blue) the cobalt coating and (in gray) the magnetic particles.
Figure 22B:
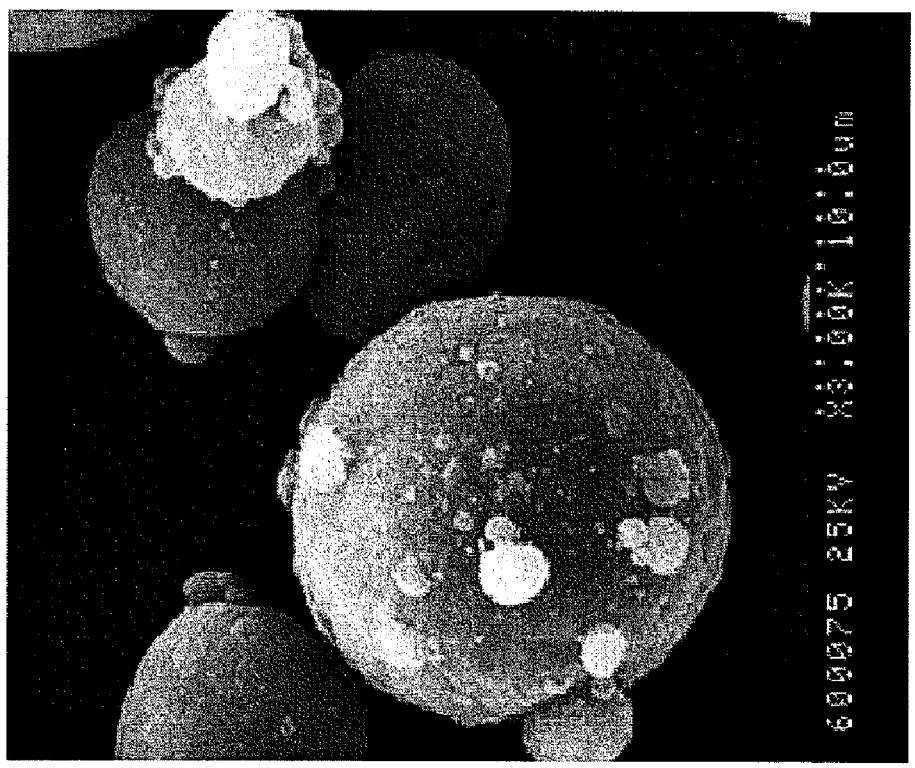
FIG. 22 (a-b) shows Scanning Electron Microscope (SEM) micrographs of macro-aluminum particles.
Figure 22A:
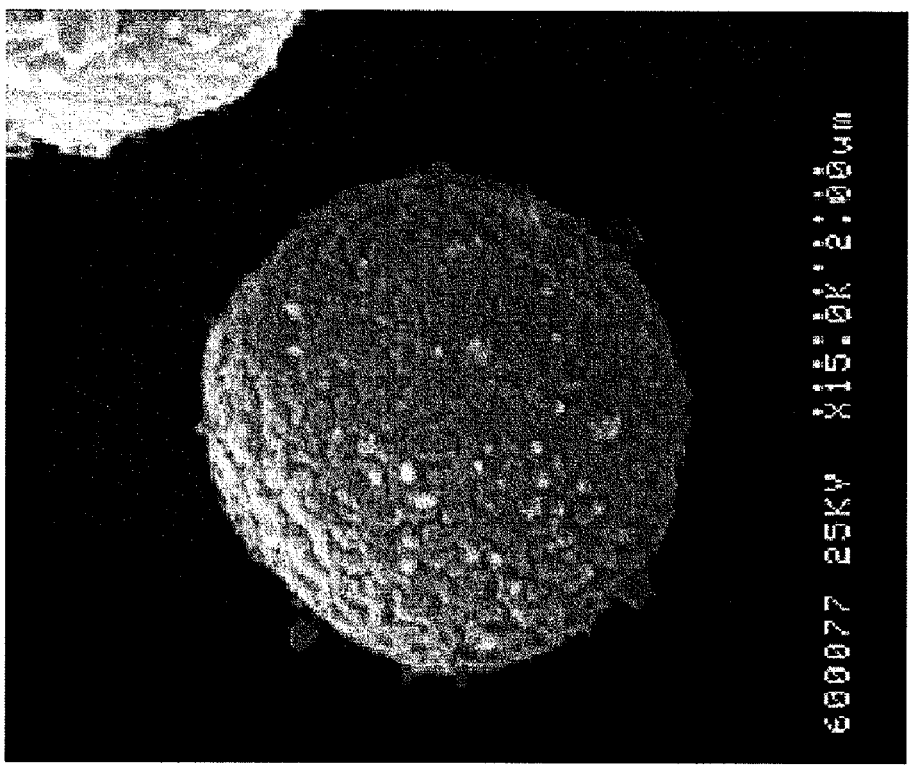
Figure 23B:
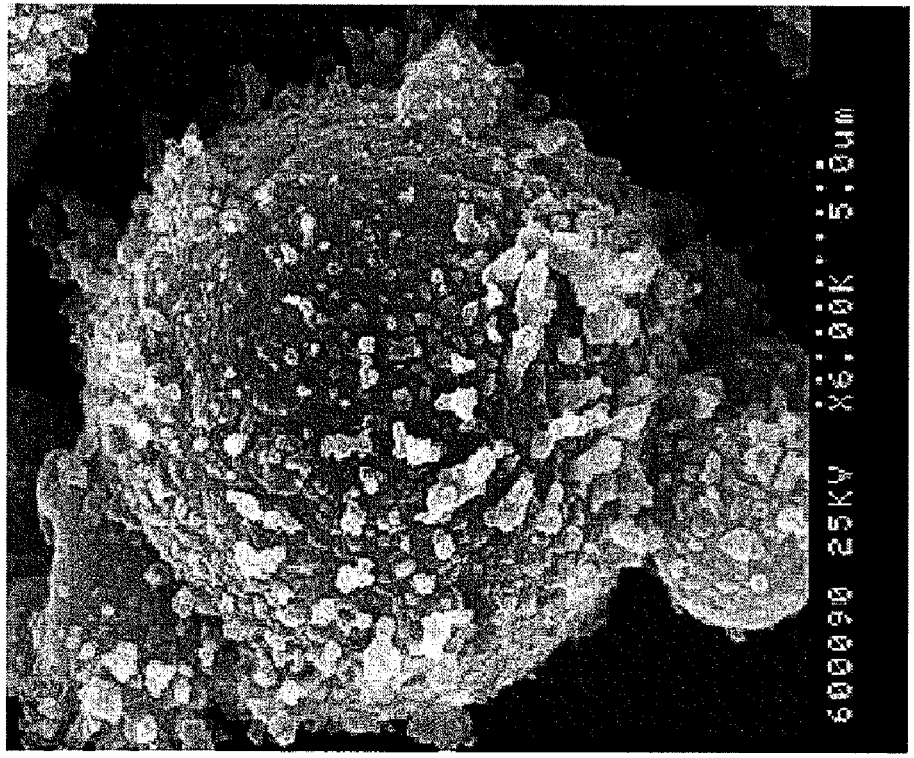
FIG. 23 (a-b) shows Scanning Electron Microscope (SEM) micrographs of macro-aluminum particles comprising a polyacetylene coating (acetylene was the coating precursor), produced using a Dielectric Barrier Discharge Torch assembly in accordance with an embodiment of the present disclosure.
Figure 23A:
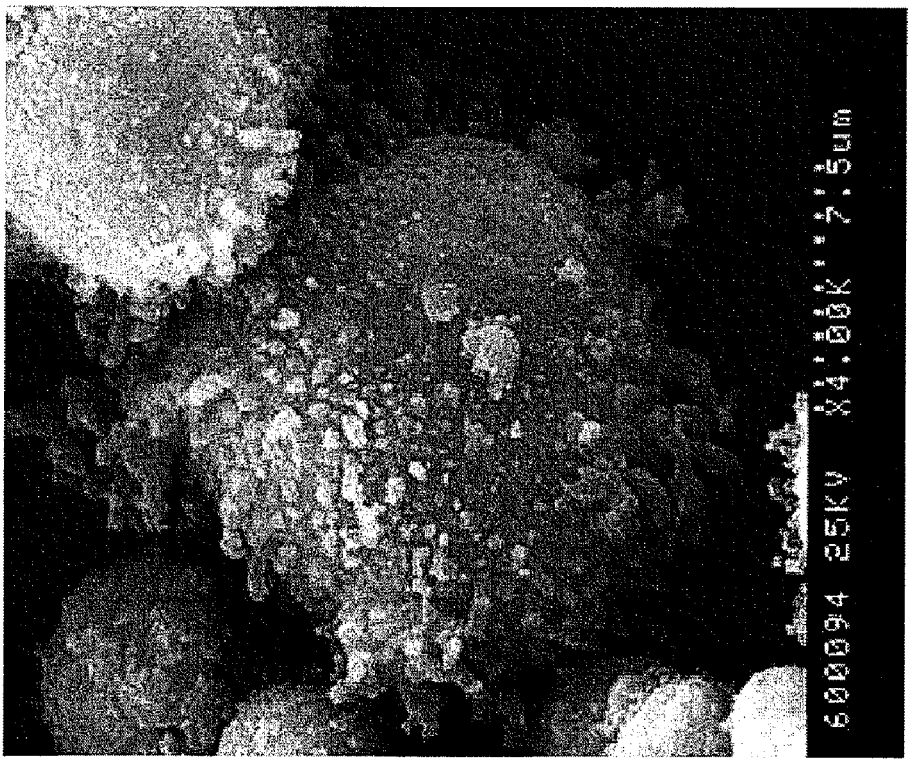
Figure 24:
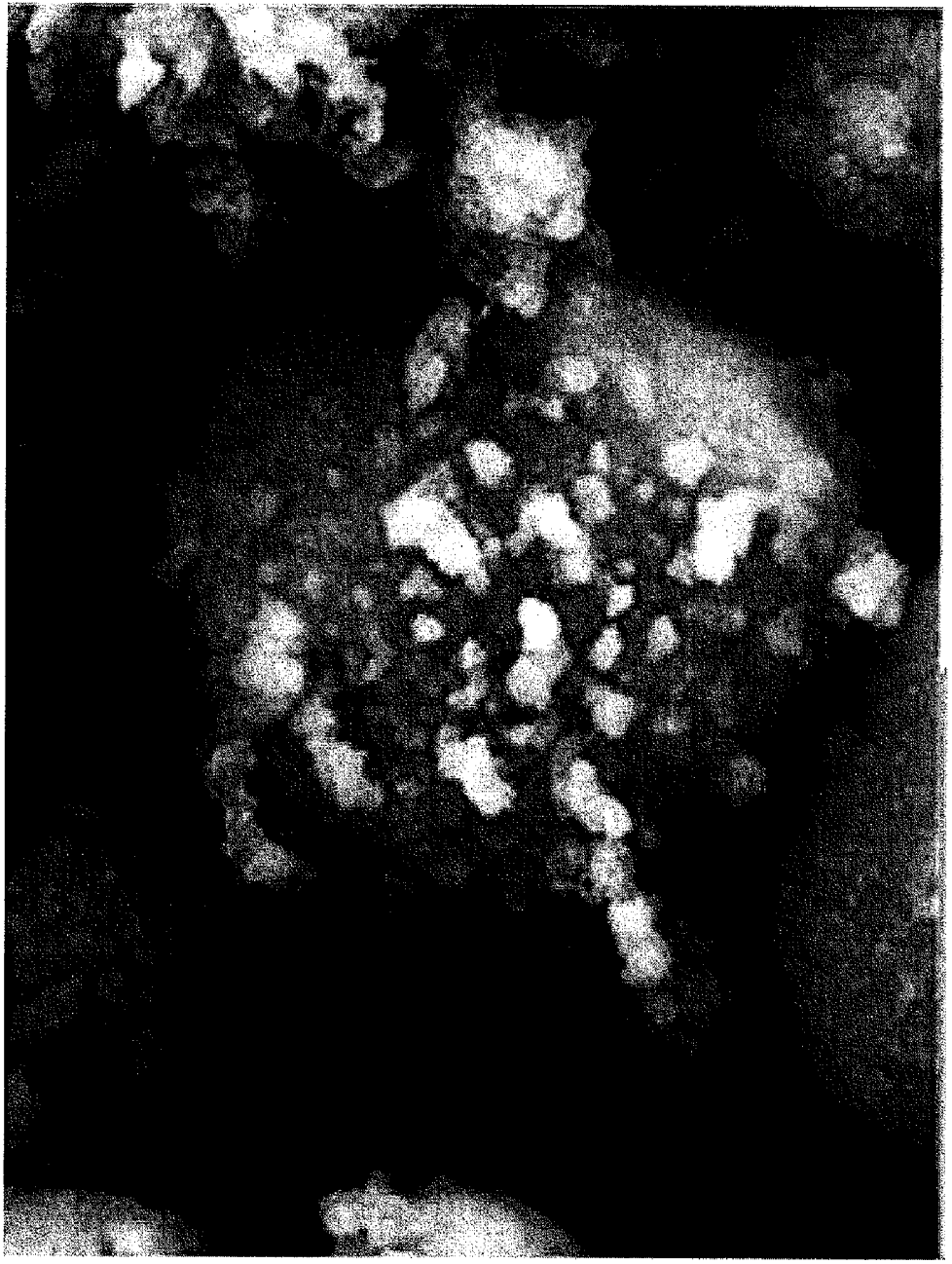
FIG. 24 shows an Energy Dispersive Spectrum (EDS) mapping of polyacetylene coated macro-aluminum particles, showing (in red) the aluminum particles and (in white-green) the polyacetylene coating.
Figure 25:
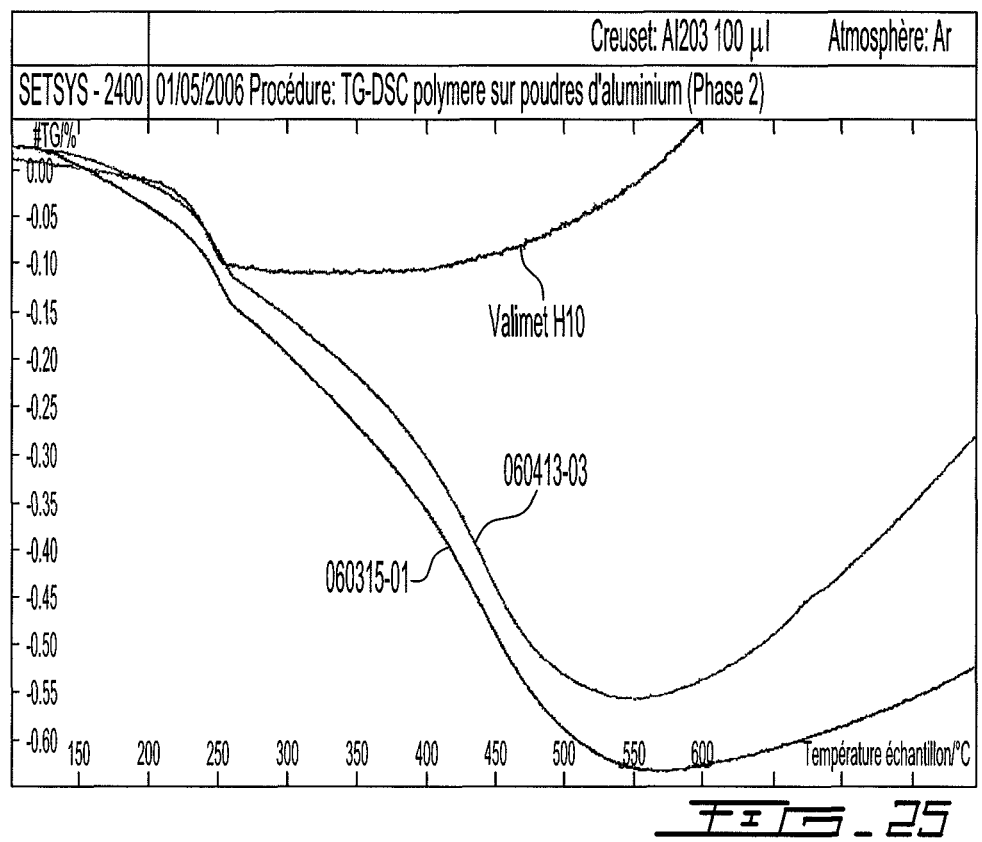
FIG. 25 shows a Thermal Gravimetric Analysis (TGA) graph illustrating the loss of mass for high density polyethylene coated aluminum particles, under an argon atmosphere, at temperatures ranging from about 100° C. to about 800° C. and a temperature increase of 10° C./min; the loss of mass at temperatures below 550° C. substantially corresponding to the amount of polymer coating added during the coating process; the observed weight increase at higher temperatures corresponds to the build-up of an oxide layer.
Figure 26A:
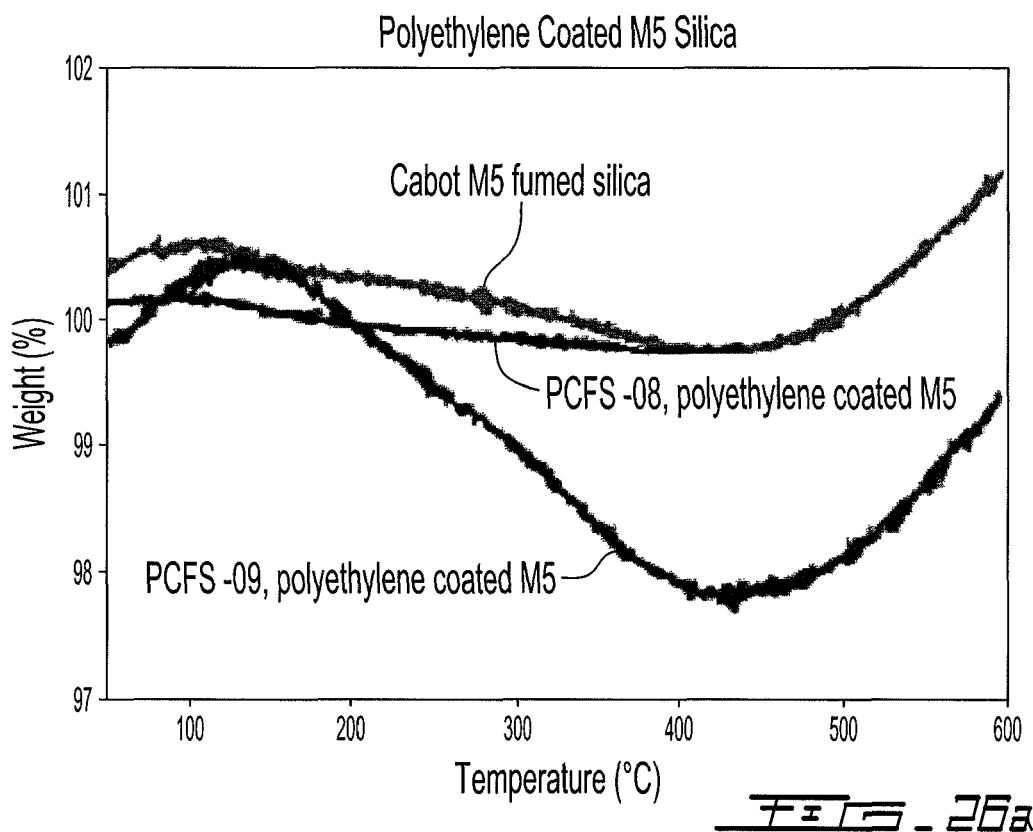
FIG. 26 shows Thermal Gravimetric Analysis (TGA) graphs illustrating the loss of mass for polyethylene (a), polybutadiene (b) and polyisoprene (c) coated silica particles, under an air atmosphere, at temperatures ranging from about 100° C. to about 600° C.; the loss of mass substantially corresponding to the amount of polymer coating added during the coating process; the observed weight increase at higher temperatures corresponds to the build-up of an oxide layer.
Figure 26B:
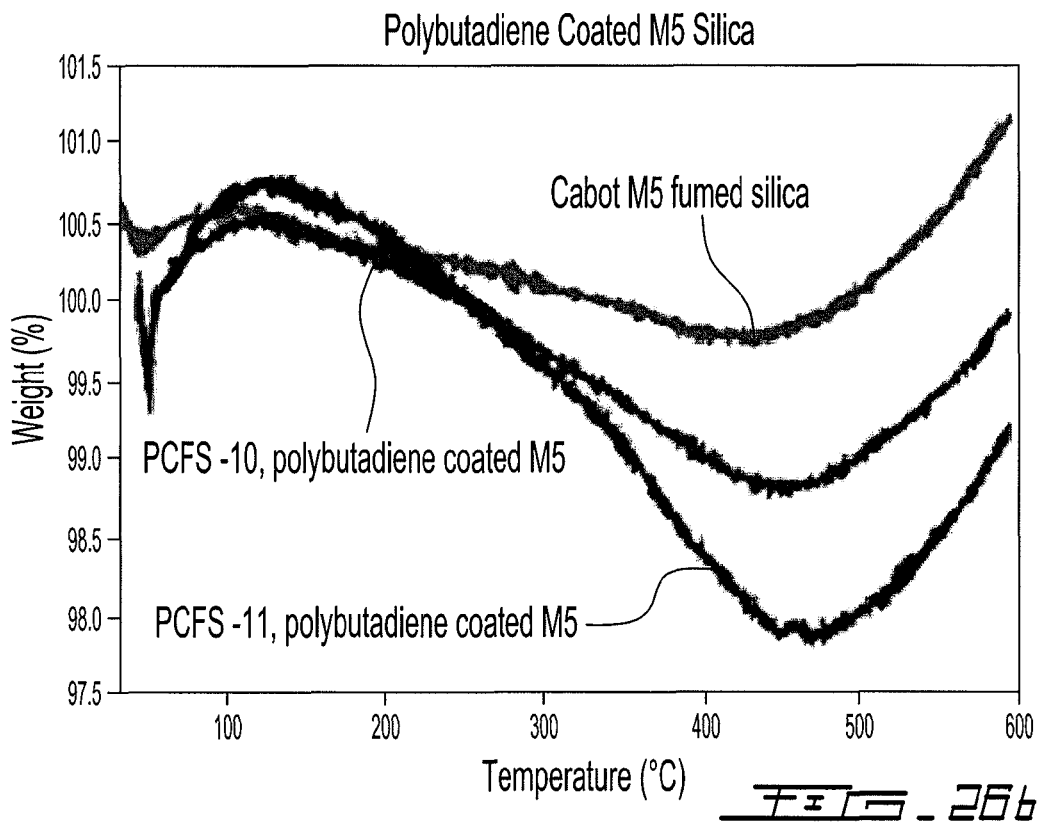
Figure 26C:
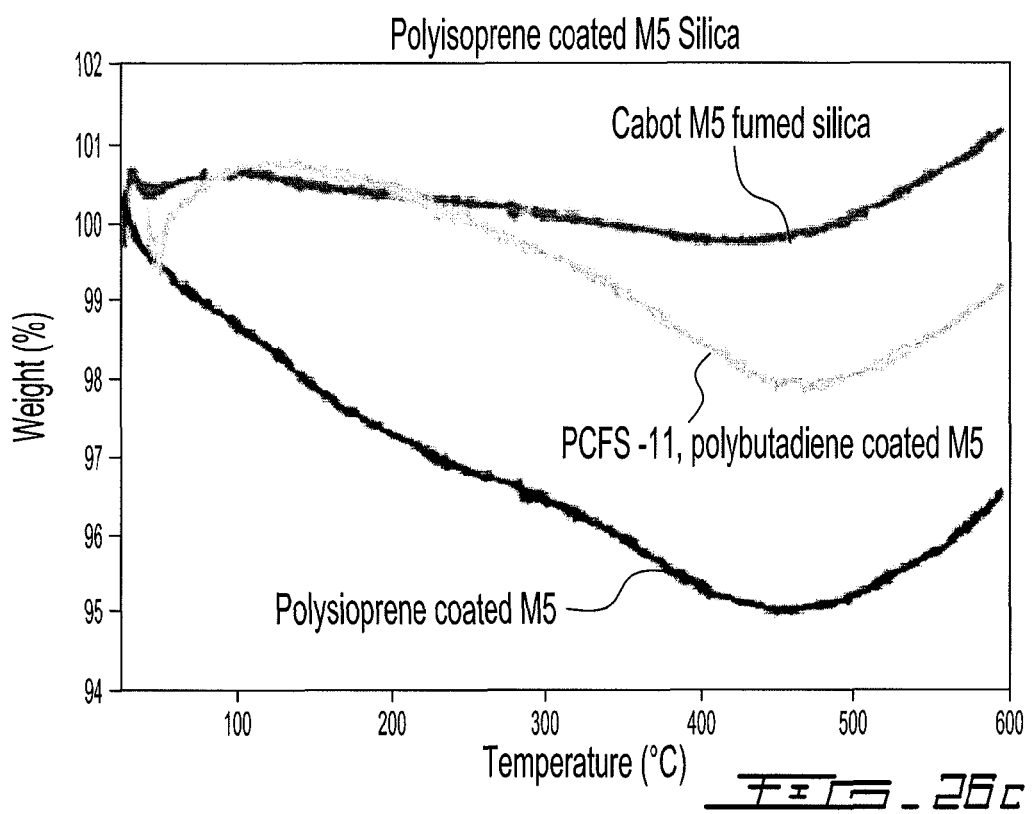

Scanning Electron Microscope (SEM) micrographs of coated powders are provided (FIGS. 10, 11, 18-20, 22 and 23). Physical characteristics of the coated powders such as the powder specific surface area (as measured using the "Brauner Emmett Teller" (BET) method) are also provided. X-ray Photoelectron Spectroscopy (XPS) results regarding the amounts of carbon added onto the surface of the powders during the coating process are tabulated. This analysis provides an accurate quantitative analysis of the concentration (%) of the elements present (atomic composition). Moreover, Energy Dispersive Spectrum (EDS) mapping results are shown, providing information regarding the location of the coating on the powder surface (FIGS. 21 and 24). Finally, Thermal Gravimetric Analysis (TGA) results are shown, providing quantitative information regarding the amount of coating (i.e. polymer) deposited on the powders (FIGS. 25 and 26).

The specific surface area (BET), before and after coating, for silica nanopowder was tested and the results illustrated hereinbelow in Table 4. The significant change in the specific surface area is a clear indication of a significant de-agglomeration taking place during the coating process.

TABLE 4

Specific surface area results for silica and silica coated nanoparticles.

| Sample # | BET ($m^2/g$) |
|---|---|
| Original silica nanopowder | 120.9 |
| 060613-01 | 227.3 |
| 060613-02 | 175.1 |
| 060613-03 | 170.5 |

The X-ray Photoelectron Spectroscopy (XPS) results, before and after coating, for aluminum powders are illustrated hereinbelow in Tables 5 and 6. The binding energy $E_b$ is dependent on the oxidation state and the chemical bonds around the atom where the electron moved. Only the electrons generated near the surface, up to a depth of 100 Å or less, are detected. A slow scan of the carbon atom provides for information regarding its type of bonding.

TABLE 5

XPS results obtained for alumina and alumina coated powders.

| | Atomic % | | | |
|---|---|---|---|---|
| Sample # | % C | % O | % Al | % Si |
| Valimet H10 (Original Aluminum powders) | 15.7 | 55.4 | 28.9 | |
| 060315-01 | 49.2 | 36.0 | 14.8 | |
| 060413-03 | 46.0 | 38.6 | 15.4 | |
| Original Silica Nano Particles (Cabot SiO2 fumed) | 0 | 68.3 | 0 | 31.2 |
| Butadiene coated (060810-02) | 11.9 | 59.3 | 0 | 28.8 |
| Isoprene coated (060914-01) | 11.1 | 61.2 | 0 | 27.7 |
| Original Aluminum Macro particles | 15.7 | 55.4 | 28.9 | 0 |
| $SiO_xC_yH_z$ coated (060720-02) | 11.4 | 59.7 | 13.7 | 14.5 |
| Original Aluminum Nano particles | 3.2 | 61.7 | 35 | 0 |
| $SiO_xC_yH_z$ coated (060803-01) | 12.1 | 54.7 | 27.5 | 5.7 |
| Original Alumina Nano particles | 4.3 | 59.4 | 36.2 | 0 |
| $SiO_xC_yH_z$ coated (060913-02) | 3.8 | 56.8 | 31.9 | 7.5 |

TABLE 6

XPS results for the type of bonding for the carbon atom.

| Photopeak | Peak (eV) | Assignment |
|---|---|---|
| C 1s | 285 | C—H/C—C |
| C 1s | 286.3-286.7 | C—O |
| C 1s | 287.8-288.2 | C═O |

In the case of aluminum powders, the TGA analysis illustrated a loss of mass not exceeding 0.5%, indicative of the presence of a thin film. At about 300° C., a partial thermocracking of a small amount of high density polyethylene coated aluminum powder causes a continuous decrease in mass. At temperatures ranging from about 370° C. to about 500° C., a decrease in mass corresponds to a complete pyrolysis of the high density polyethylene chains. The observed mass increase at higher temperatures is indicative of the oxidation of the aluminum powders. A typical TGA graph, obtained with high density polyethylene coated aluminum powder, is illustrated in FIG. 25.

It is to be understood that the invention is not limited in its application to the details of construction and parts as described hereinabove. The invention is capable of other embodiments and of being practiced in various ways. It is also understood that the phraseology or terminology used herein is for the purpose of description and not limitation. Hence, although the present invention has been described hereinabove by way of illustrative embodiments thereof, it can be modified, without departing from the spirit, scope and nature of the subject invention as defined in the appended claims.

References

1. He, W.; Guo, Z.; Pu, Y.; Yan, L.; and Si, W.; Polymer coating on the surface of zirconia nanoparticles by inductively coupled plasma polymerization. *Journal of Applied Physics Letters*, 2004, 85(6), 896.
2. Shi, D.; Wang, S. X.; Van Ooij, W. J.; Wang, L. M.; Zhao, J.; and Yu, Z.; Uniform deposition of ultra-thin polymer films on the surfaces of $Al_2O_3$ nanoparticles by a plasma treatment. *Journal of Applied Physics Letters*, 2001, 78(9), 1243.
3. Shi, D.; Lian, J.; He, P.; Wang, L. M.; Van Ooij, W. J.; Schulz, M.; Liu, Y.; and Mast, D. B.; Plasma deposition of ultra-thin polymer films on carbon nanotubes. *Applied Physics Letters*, 2002, 81(27), 5216.
4. Schallehn, M.; Winterer, M.; Wirich, T. E.; Keiderling, U.; and Hahn, H.; In Situ Preparation of Polymer Coated Alumina Nanopowders by Chemical Vapor Synthesis. *Chemical Vapor Deposition*, 2003, Vol. 9(1), 40.
5. Vollath, D.; and Szabo, D. V.; Oxide-polymer nanocomposites as new luminescent materials. *Journal of Nanoparticle Research*, 2004, 6, 181-191.
6. Vollath, D. and Szabo, D. V.; Coated nanoparticles: A new way to improved nanocomposites. *Journal of Nanoparticle Research*, 1999, 1, 235.
7. Lik Hang Chau, J; Hsu, M.; Hsieh, C.; and Kao, C.; Microwave plasma synthesis of silver nanopowders. *Materials Letters*, 2005, Vol 59, 905.
8. Lik Hang Chau, J; Hsu, M.; Hsieh, C.; and Kao, C.; Microwave plasma synthesis of Co and SiC-coated Co nanopowders. *Materials Letters*, 2006, Vol 60, 947.
9. Kouprine, A.; Gitzhofer, F.; Boulos, M.; and Fridman, A.; Polymer like C:H thin film coating of nanopowders in capacitively coupled rf discharge. *Plasma Chemistry and Plasma Processing*, 2004, 24(2), 189.
10. Dumitrache, F.; Morjan, I.; Alexandrescu, R.; Morjan, R. E.; Voicu, I.; Sandu, I.; Soare, I.; Ploscaru, M.; Fleaca, C.; Ciupina, V.; Prodan, G.; Rand, B.; Brydson, R; and Woodword, A. Nearly monodispersed carbon coated iron nanoparticles for the catalytic growth of nanotubes/nanofibers. *Diamond and Related Materials*, 2004, 13, 362.
11. Ermoline, A.; Shoenitz, M.; Dreizein, E.; and Yao, N.; Production of carbon coated aluminum nanopowders in pulsed microarc discharge. *Nanotechnology*, 2002, 13, 638.
12. Sawada, Y.; Kogoma, M.; Plasma polymerized tetrafluoroethelyne coatings on silica particles by atmospheric pressure glow discharge. *Powder Technology*, 1997, 90, 245.
13. Lei, H.; Tang, Y.; Li, J.; Luo, J.; and Li, X.; In-Situ Organic Coating of Metal Nanoparticles. *Applied Physics Letter*, 2006, 88.
14. Kogelschatz, U.; Filamentary, Patterned, and Diffuse Barrier Discharges.; *IEEE Transactions on Plasma Science*, 2002, 30(4), 1400.
15. Becker, K. H.; Kogelschatz, U.; Schoenbach, K. H.; and Barker, R. J. Eds., Non-Equilibrium Air Plasmas at Atmospheric Pressure, *IOP* 2004, Chapter 6, 276-306.
16. Kogelschatz, U.; Dielectric-barrier discharges: Their history, discharge physics, and industrial applications. *Plasma Chemistry and Plasma Processing*, 2003, 23(1), 1.
17. Kogelschatz, U.; and Eliasson, B. Ozone Generation and Applications. *Handbook of Electrostatic Processes*: Chang, J. S.; Kelly A. J. and Crowley J. M. Eds. (Marcel Dekker, New York 1995), 581-605.
18. Manley, T. C.; The electrical characteristics of the ozone discharge. *Trans. Electrochem. Soc.* 1943, 84, 83.
19. Bretagnol, F.; Tatoulian, M.; Khonsari, F. A.; Lorang, G.; and Amouroux, J.; Surface modification of polyethylene powder by nitrogen and ammonia low pressure plasma in a fluidized bed reactor. *Reactive and functional polymers*, 2004, 61: p. 221.
20. Leroy, J. B.; Fatah, N.; Mutel, B. and Grimblot. J. Treatment of polyethylene powder using a remote nitrogen plasma reactor coupled with a fluidized bed: influence on wettability and flowability. *Plasma and Polymers*, 2003, 8(1): p. 13.

What is claimed is:

1. A process for surface treating powder particles comprising:
    a) feeding a particulate powder material into a Dielectric Barrier Discharge Torch assembly comprising an upstream shell-type electrode and a downstream shell-type electrode, each shell-type electrode comprising a pair of semi-cylindrical electrodes, wherein the downstream shell-type electrode is disposed in a staggered configuration relative to the upstream shell-type electrode;
    b) in-flight modifying the surface properties of the particles in the Dielectric Barrier Discharge Torch assembly producing surface treated particles; and
    c) collecting the surface treated particles.

2. The process of claim 1, wherein (b) comprises reacting the surface of the particles with plasma discharge.

3. The process of claim 1, wherein (b) comprises generating a coating material by injecting a coating material precursor into the Dielectric Barrier Discharge Torch assembly and depositing said coating material on the surface of the particles producing coated particles.

4. The process of claim 3, wherein the coated particles comprise a coating selected from the group consisting polymeric, organic, inorganic, metallic, oxide, nitride and carbide.

5. The process of claim 3, wherein said coating material precursor comprises a monomer undergoing plasma polymerization.

6. The process of claim 5, wherein said monomer is selected from the group consisting of acetylene, ethylene, isoprene, hexamethyldisiloxane, tetraethyloxysilane, tetraethyl oxysilicane, diethyl dimethyl siloxane, 1,3-butadiene, styrene, methyl methacrylate, tetrafluoroethelyne, methane, ethane, propane, butane, pentane, hexane, cyclohexane, propylene, benzene, pyrrole, 1-hexene, allylamine, acetyl acetone, ethylene oxide, glycidyl methacrylate, acetonitrile, tetrahydrofuran, ethylacetate, acetic anhydride, aminopropyl trimethoxysilane, aminopropyl triethoxysilane, triethoxyvinyl silane, 1octanol, acrylic acid, ferrocene, cobaltocene, cyclooctateraen iron tricarbonyl, methyl cyclopentadienyl iron dicarbonyl, dicyclopentadienyl iron dicarbonyl dimmer, cyclopentadienyl cobalt cobatlacetylacetonate, nickel acetyleacetonate, dimethyl-(2,4-pentane-dionato) gold (III), nickel carbonyl, iron carbonyl, tin acetylacetonate, indium-acetylacetonate and indium tetramethylheptanedionate.

7. The process of claim 1, wherein the powder particles are selected from the group consisting of micro-particles, nanoparticles and mixtures thereof.

8. The process of claim 7, wherein the powder particles are selected from the group consisting of polymer particles, metallic particles, oxides of metallic particles and mixtures thereof.

9. The process of claim 1, wherein the Dielectric Barrier Discharge Torch assembly operates (i) at atmospheric pressures or soft vacuum conditions and (ii) in intermittent mode.

* * * * *